United States Patent
Kim

(10) Patent No.: US 11,415,896 B2
(45) Date of Patent: Aug. 16, 2022

(54) DISSECTION METHOD FOR LAYOUT PATTERNS IN SEMICONDUCTOR DEVICE, OPTICAL PROXIMITY CORRECTION METHOD INCLUDING THE SAME AND METHOD OF MANUFACTURING SEMICONDUCTOR DEVICE INCLUDING THE SAME

(71) Applicant: SAMSUNG ELECTRONICS CO., LTD., Suwon-si (KR)

(72) Inventor: Sang-Wook Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 433 days.

(21) Appl. No.: 16/369,932

(22) Filed: Mar. 29, 2019

(65) Prior Publication Data

US 2020/0081352 A1   Mar. 12, 2020

(30) Foreign Application Priority Data

Sep. 6, 2018   (KR) .......................... 10-2018-0106297

(51) Int. Cl.
*G03F 7/20*   (2006.01)
*G06F 30/30*   (2020.01)

(52) U.S. Cl.
CPC .......... *G03F 7/70441* (2013.01); *G06F 30/30* (2020.01)

(58) Field of Classification Search
CPC ........ G03F 7/70441; G03F 1/36; G06F 30/30; G06T 7/11; G06T 2207/30148
See application file for complete search history.

(56) References Cited

U.S. PATENT DOCUMENTS

| | | |
|---|---|---|
| 5,815,685 A | 9/1998 | Kamon |
| 5,879,844 A | 3/1999 | Yamamoto et al. |
| 6,077,310 A | 6/2000 | Yamamoto et al. |
| 6,243,855 B1 | 6/2001 | Kobayashi et al. |
| 6,453,274 B2 | 9/2002 | Kamon |
| 7,000,208 B2 | 2/2006 | Zhang |

(Continued)

FOREIGN PATENT DOCUMENTS

| | | |
|---|---|---|
| JP | 3947755 B2 | 4/2007 |
| JP | 3954216 B2 | 5/2007 |

(Continued)

*Primary Examiner* — Jack Chiang
*Assistant Examiner* — Aric Lin
(74) *Attorney, Agent, or Firm* — Lee IP Law, P.C.

(57) ABSTRACT

In a dissection method for layout patterns in a semiconductor device, a design layout is divided into a plurality of patches. A plurality of first dissection points for target layout patterns in the target patch and neighboring layout patterns in the neighboring patches are set based on vertexes of the target and neighboring layout patterns. At least one second dissection point for at least one exceptional layout pattern is set. The at least one exceptional layout pattern is a layout pattern in which the first dissection points are not set and which extends to pass through boundaries of one patch. A plurality of third dissection points for the target layout patterns and the neighboring layout patterns are set based on the first and second dissection points. The target layout patterns are divided into a plurality of target segments based on the first, second and third dissection points.

18 Claims, 20 Drawing Sheets

(56) References Cited

U.S. PATENT DOCUMENTS

| | | |
|---|---|---|
| 8,392,854 B2 | 3/2013 | Kim et al. |
| 8,589,830 B2 | 11/2013 | Chang et al. |
| 9,189,588 B2 | 11/2015 | Cheng et al. |
| 9,390,217 B2 | 7/2016 | Wang et al. |
| 9,619,607 B2 | 4/2017 | Tao et al. |
| 9,996,658 B2 | 6/2018 | Kim et al. |
| 2002/0004714 A1* | 1/2002 | Jones .................. G03F 7/70441 703/13 |
| 2003/0110465 A1* | 6/2003 | Zhang ...................... G03F 1/84 716/53 |
| 2004/0088149 A1* | 5/2004 | Cobb .................. G03F 7/70441 703/13 |
| 2008/0309897 A1* | 12/2008 | Wong ...................... G03F 7/705 355/44 |
| 2015/0125063 A1* | 5/2015 | Hsieh ...................... G03F 1/36 382/149 |
| 2017/0329888 A1* | 11/2017 | Kim ...................... G06F 30/398 |

FOREIGN PATENT DOCUMENTS

| | | |
|---|---|---|
| JP | 4510118 B2 | 5/2010 |
| KR | 10-2017-0128719 A | 11/2017 |

\* cited by examiner

FIG. 14
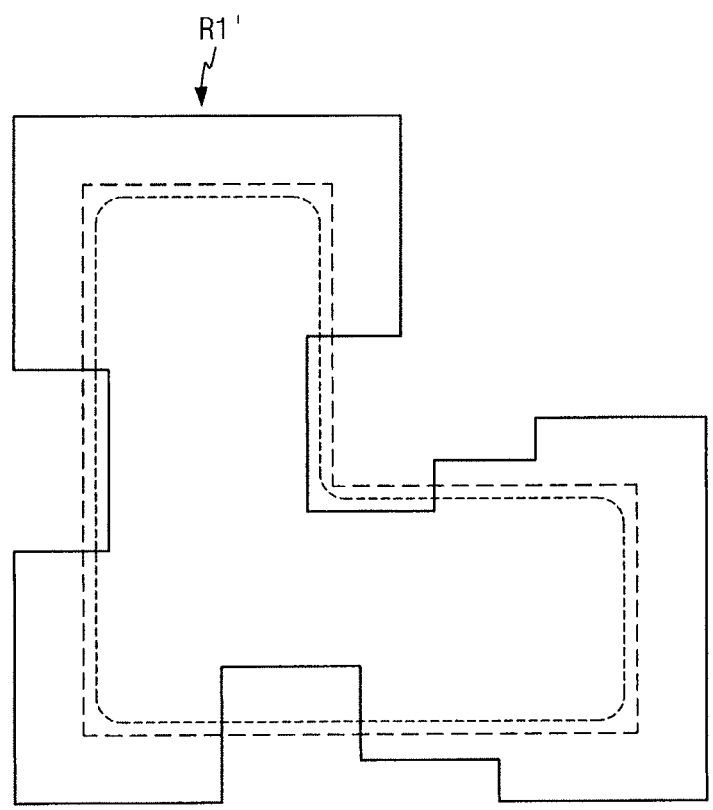
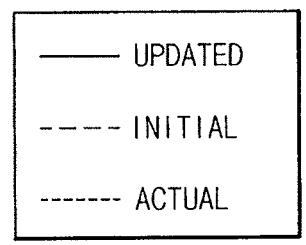

DISSECTION METHOD FOR LAYOUT PATTERNS IN SEMICONDUCTOR DEVICE, OPTICAL PROXIMITY CORRECTION METHOD INCLUDING THE SAME AND METHOD OF MANUFACTURING SEMICONDUCTOR DEVICE INCLUDING THE SAME

CROSS-REFERENCE TO RELATED APPLICATION

Korean Patent Application No. 10-2018-0106297, filed on Sep. 6, 2018, in the Korean Intellectual Property Office, and entitled: "Dissection Method for Layout Patterns in Semiconductor Device, Optical Proximity Correction Method Including the Same and Method for Manufacturing Semiconductor Device Including the Same," is incorporated by reference herein in its entirety.

BACKGROUND

1. Field

Example embodiments relate to semiconductor device fabrication, and more particularly to dissection methods for layout patterns in semiconductor devices, optical proximity correction methods including the dissection methods, and methods of manufacturing semiconductor devices using the optical proximity correction methods.

2. Description of the Related Art

Semiconductor devices are widely used in an electronic industry due to their small sizes, multi-functional characteristics, and/or low manufacture costs. As the electronic industry has been developed, semiconductor devices with excellent characteristics have been demanded. For example, demands for high-reliable, high-speed, and/or multi-functional semiconductor devices have become increased rapidly. To satisfy these demands, semiconductor devices have become highly integrated, and structures of semiconductor devices have become more complicated.

Semiconductor devices may be manufactured through a photolithography process. Layout patterns may be printed or implemented on a semiconductor substrate by the photolithography process. As semiconductor devices have become highly integrated, distances between layout patterns of a mask have been reduced. For example, the layout patterns may be very close to each other due to reduced distances therebetween. The layout patterns, close to each other, may cause interference and diffraction of light such that a distorted layout, different from a desired layout, on a semiconductor substrate is printed on the semiconductor substrate. To address these problems, resolution enhancement technology (e.g., optical proximity correction) may be used for preventing the distortion of the layout patterns.

SUMMARY

Embodiments are directed to a dissection method for layout patterns in a semiconductor device, the method comprising: dividing a design layout for a target layer, on which an optical proximity correction process is performed, into a plurality of patches; selecting a target patch and a plurality of neighboring patches surrounding the target patch among the plurality of patches; setting a plurality of first dissection points for target layout patterns in the target patch and neighboring layout patterns in the plurality of neighboring patches based on vertexes of the target layout patterns and vertexes of the neighboring layout patterns; setting at least one second dissection point for at least one exceptional layout pattern among the target layout patterns and the neighboring layout patterns, the at least one exceptional layout pattern being a layout pattern in which the plurality of first dissection points are not set and which extends to pass through boundaries of one patch; setting a plurality of third dissection points for the target layout patterns and the neighboring layout patterns based on the plurality of first dissection points and the at least one second dissection point; and dividing the target layout patterns into a plurality of target segments based on the plurality of first dissection points, the at least one second dissection point and the plurality of third dissection points.

Embodiments are directed to an optical proximity correction method, the method comprising: dividing a design layout for a target layer, on which an optical proximity correction process is performed, into a plurality of patches; dividing a plurality of layout patterns in the plurality of patches into a plurality of segments; and biasing at least one of the plurality of segments to obtain a corrected design layout, wherein dividing the plurality of layout patterns into the plurality of segments includes: selecting a target patch and a plurality of neighboring patches surrounding the target patch among the plurality of patches; setting a plurality of first dissection points for target layout patterns in the target patch and neighboring layout patterns in the plurality of neighboring patches based on vertexes of the target layout patterns and vertexes of the neighboring layout patterns; setting at least one second dissection point for at least one exceptional layout pattern among the target layout patterns and the neighboring layout patterns, the at least one exceptional layout pattern being a layout pattern in which the plurality of first dissection points are not set and which extends to pass through boundaries of one patch; setting a plurality of third dissection points for the target layout patterns and the neighboring layout patterns based on the plurality of first dissection points and the at least one second dissection point; and dividing the target layout patterns into a plurality of target segments based on the plurality of first dissection points, the at least one second dissection point and the plurality of third dissection points Embodiments are directed to a method for manufacturing a semiconductor device, the method comprising: obtaining a design layout for a layer in the semiconductor device; forming a corrected design layout by performing an optical proximity correction process on the design layout; fabricating a photomask based on the corrected design layout; and forming the layer on a substrate with on the photomask, wherein forming the corrected design layout includes: dividing the design layout into a plurality of patches; dividing a plurality of layout patterns in the plurality of patches into a plurality of segments; and biasing at least one of the plurality of segments to obtain the corrected design layout, wherein dividing the plurality of layout patterns into the plurality of segments includes: selecting a target patch and a plurality of neighboring patches surrounding the target patch among the plurality of patches; setting a plurality of first dissection points for target layout patterns in the target patch and neighboring layout patterns in the plurality of neighboring patches based on vertexes of the target layout patterns and vertexes of the neighboring layout patterns; setting at least one second dissection point for at least one exceptional layout pattern among the target layout patterns and the neighboring layout patterns, the at least one exceptional layout pattern being a layout pattern in which the plurality of first dissection points are not set and which extends to pass through boundaries of one patch; setting a plurality of third dissection points for the target layout patterns and the neighboring layout patterns based on the plurality of first dissection points and the at least one second dissection point; and dividing the target layout patterns into a plurality of target segments based on the plurality of first dissection points, the at least one second dissection point and the plurality of third dissection points.

BRIEF DESCRIPTION OF THE DRAWINGS

Features will become apparent to those of skill in the art by describing in detail exemplary embodiments with reference to the attached drawings in which:

FIGS. 11 through 14 illustrate diagrams of an optical proximity correction method according to example embodiments.

DETAILED DESCRIPTION

Figure 1:
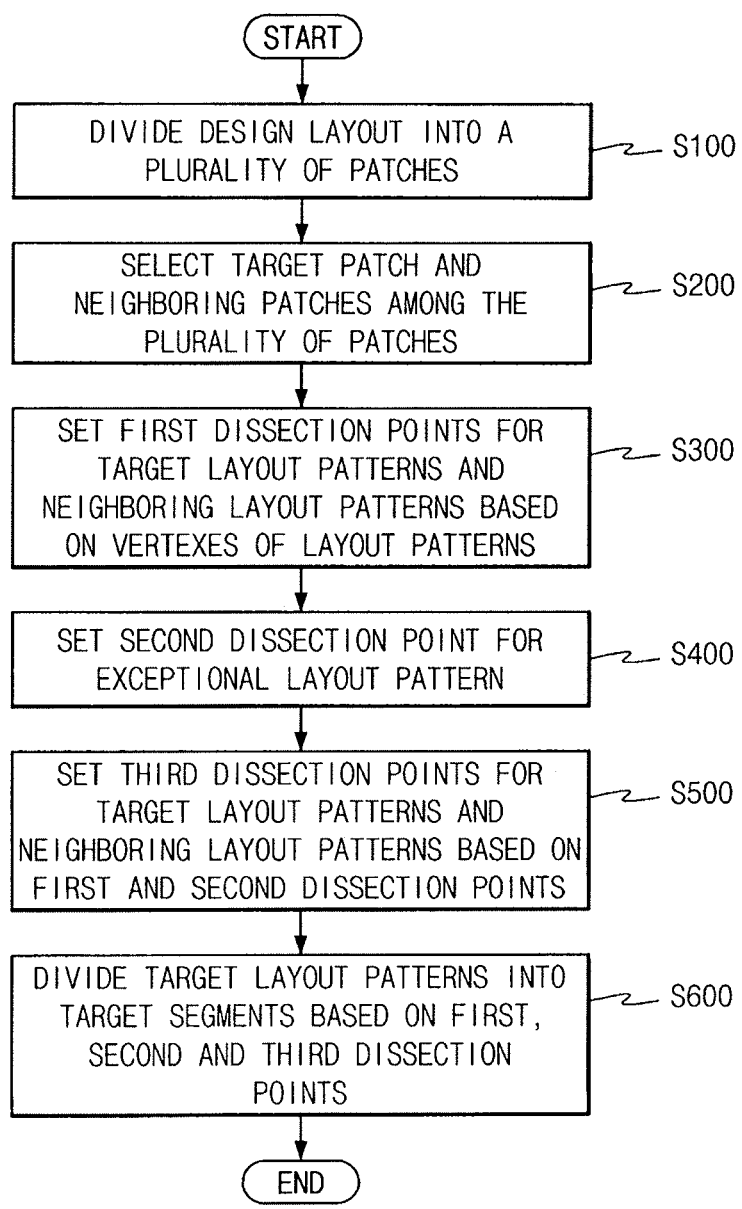
FIG. 1 illustrates a flowchart of dissection methods for layout patterns in a semiconductor device according to example embodiments.

Hereafter, example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart of dissection methods for layout patterns in a semiconductor device according to example embodiments.

Referring to FIG. 1, the dissection methods according to the example embodiments may be used to perform an optical proximity correction (OPC) process for designing and manufacturing a semiconductor device. The optical proximity correction process may be performed to correct/compensate an optical proximity effect, which may occur in a photolithography process. The optical proximity effect may be an unintended/distorted optical effect (e.g., refraction or diffraction of light), which may occur in the photolithography process. The optical proximity correction process will be described in detail with reference to FIGS. 10 through 14 below.

In the dissection methods for layout patterns in the semiconductor device according to example embodiments, a design layout (e.g., image layout) for a target layer (e.g., a physical layer), which may be applied by an optical proximity correction process, may be divided into a plurality of patches (step S100). The design layout may include a plurality of circuit patterns, layout patterns and/or corresponding polygons, which may be generated with a design tool (e.g., a design tool 32 in FIG. 15). Each of the plurality of patches may be a standard unit for performing the optical proximity correction process, on which the optical proximity correction process is performed.

A target patch and a plurality of neighboring patches surrounding the target patch may be selected among the plurality of patches (step S200). The optical proximity correction process may be performed on the target patch. The plurality of neighboring patches may be adjacent to the target patch and may affect the optical proximity correction process for the target patch. The plurality of patches, the target patch and the plurality of neighboring patches will be described in detail with reference to FIGS. 2 through 9 below.

A plurality of first dissection points (e.g., division points) for target layout patterns in the target patch and neighboring layout patterns in the plurality of neighboring patches may be set or allocated based on vertexes of the target layout patterns and vertexes of the neighboring layout patterns (step S300). A method for setting the plurality of first dissection points will be described in detail with reference to FIGS. 4 and 5 below.

At least one second dissection point for at least one exceptional layout pattern among the target layout patterns and the neighboring layout patterns may be set or allocated (step S400). The at least one exceptional layout pattern may be a layout pattern in which the plurality of first dissection points are not set or allocated. The at least one exceptional layout pattern may extend to pass through boundaries of one patch. In other words, the at least one exceptional layout pattern may have both ends passing through the boundaries of the one patch and may be a long layout pattern passing across the one patch beyond the boundaries of the one patch. The exceptional layout pattern may not include any first dissection point. A method for setting the at least one second dissection point will be described in detail with reference to FIG. 6 below.

A plurality of third dissection points for the target layout patterns and the neighboring layout patterns are set or allocated based on the plurality of first dissection points and the at least one second dissection point (step S500). For example, the plurality of third dissection points may be set or allocated based on locations of the plurality of first dissection points and the at least one second dissection point as reference points. A method for setting the plurality of third dissection points will be described in detail with reference to FIG. 7 below.

The target layout patterns may be divided into a plurality of target segments based on the plurality of first dissection points, the at least one second dissection point and the plurality of third dissection points (step S600). The first, second and third dissection points may be set or allocated according to both the target patch and the plurality of neighboring patches. In an example embodiment, the target layout patterns only in the target patch may be divided into the plurality of target segments as a result of pattern division (e.g., pattern split or pattern dissection).

In some example embodiments, steps S200 through S600 may be repeatedly or recursively performed on each of the plurality of patches. For example, when the design layout is divided into X patches (where X is a natural number greater than or equal to two), steps S200 through S600 may be performed on each of first through X-th patches, and the optical proximity correction process may be performed on each of first through X-th patches based on results of the pattern division for the X patches.

Herein, these terms "divide" and "division" may not mean only physically dividing or a physical division. In some example embodiments, the division of a segment may refer to defining one or more sections/portions of the contours, perimeters or outlines of layout patterns in a design layout. For example, the plurality of segments may be illustrated as being physically divided in FIG. 12. In an example embodiment, the segments may be physically connected or may be electrically connected to each other.

FIGS. 2 through 9 are diagrams of a dissection method for layout patterns in a semiconductor device according to example embodiments.

Figure 2:
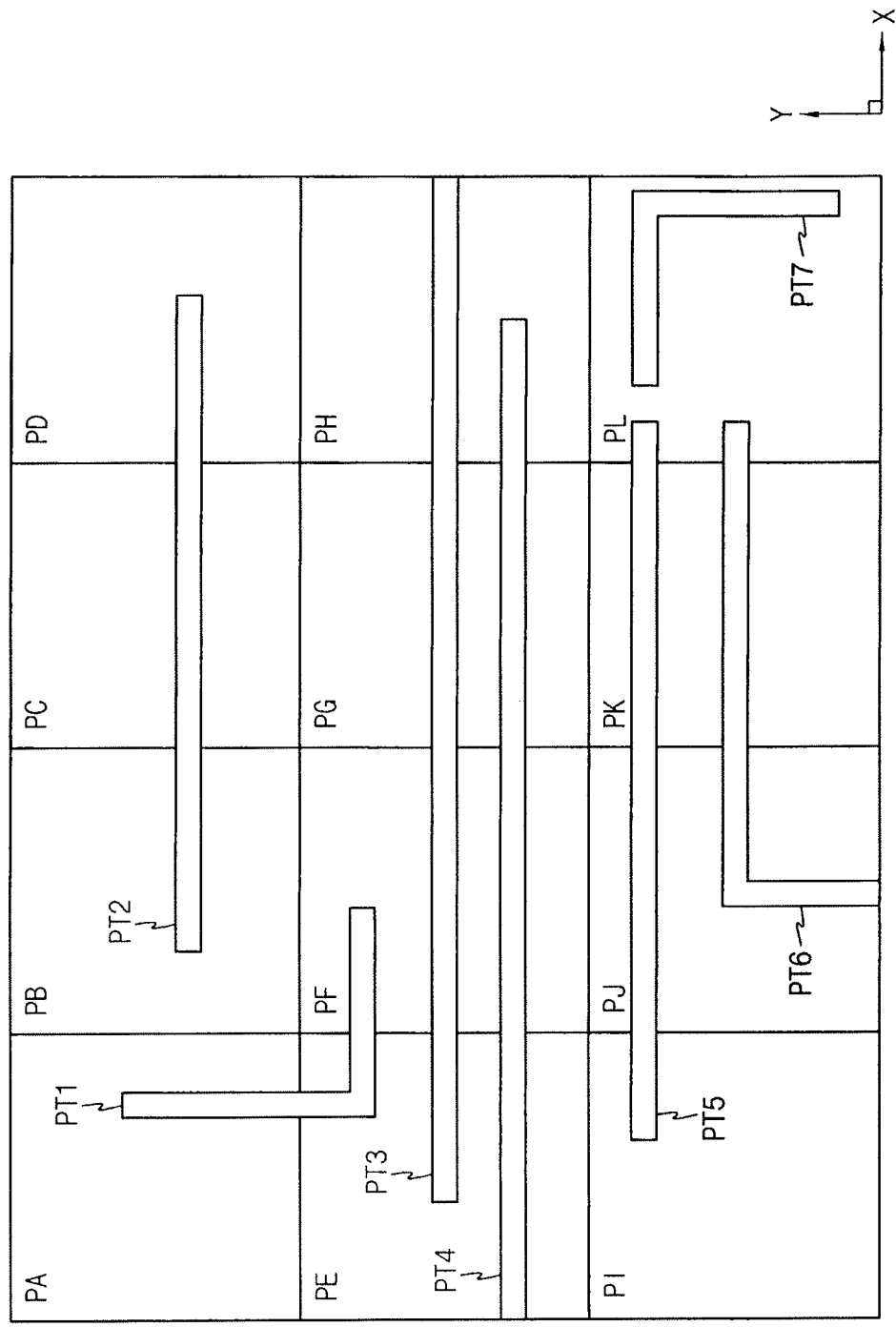
FIGS. 2 through 9 illustrate diagrams of dissection methods for layout patterns in a semiconductor device according to example embodiments.

Referring to FIGS. 1 and 2, a design layout including a plurality of layout patterns PT1, PT2, PT3, PT4, PT5, PT6 and PT7 is illustrated in FIG. 2. For example, the plurality of layout patterns PT1~PT7 may include active patterns corresponding to an active layer, and/or may include gate patterns or metal patterns corresponding to a metal layer. For example, the plurality of layout patterns PT1~PT7 may include a simple polygon (e.g., a rectangular shape) having only two long edges (or sides) and two short edges and a complex polygon (e.g., a L shape) in which two or more simple polygons are connected to each other. For example, the layout pattern PT1 may have a L shape, and the layout pattern PT2 may have a rectangular shape.

As described with reference to step S100, the design layout may be divided into a plurality of patches PA, PB, PC, PD, PE, PF, PG, PH, PI, PJ, PK and PL.

In some example embodiments, as illustrated in FIG. 2, each of the plurality of patches PA~PL may have the same shape and the same size. For example, each of the plurality of patches PA~PL may have a rectangular shape or a square shape. In other example embodiments, the plurality of patches PA~PL may have different shapes or different sizes. The design layout divided into twelve patches, as illustrated in FIG. 2, is an example, the embodiment may not be limited thereto.

Figure 3:
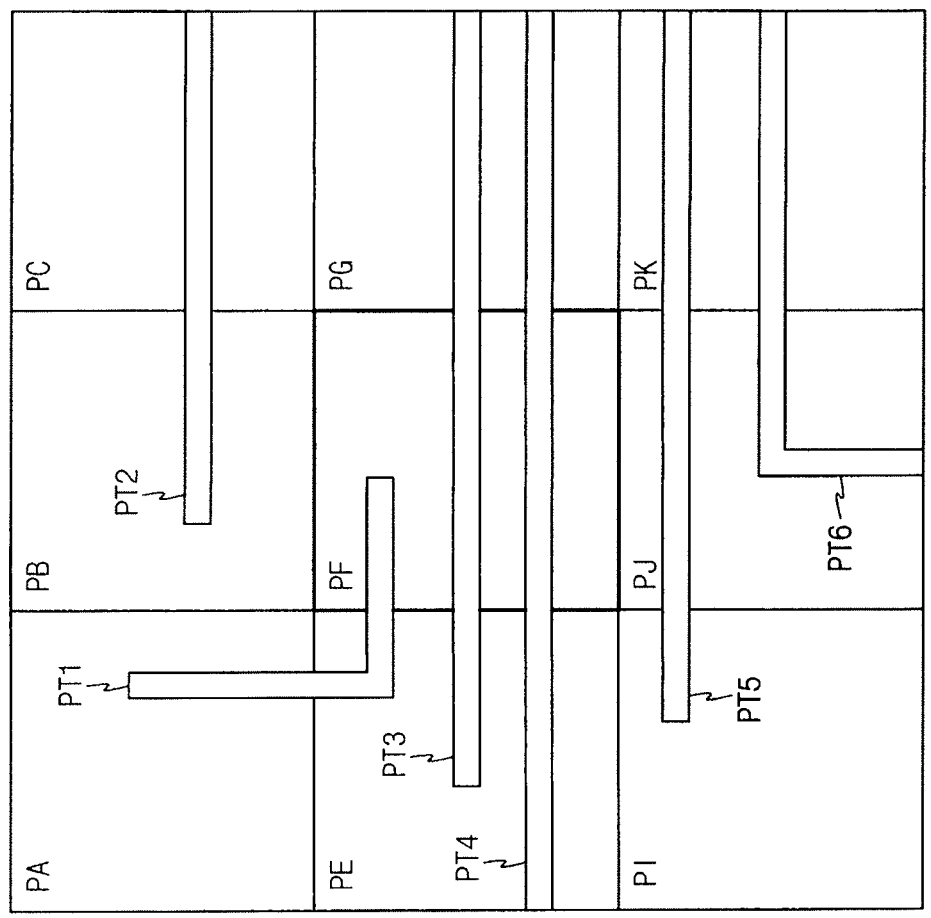

Referring to FIGS. 1 and 3, as described with reference to step S200, the target patch and the plurality of neighboring patches may be selected.

For example, the patch PF may be selected as the target patch, and the eight patches PA, PB, PC, PE, PG, PI, PJ and PK surrounding the patch PF may be selected as the plurality of neighboring patches. The layout patterns PT1, PT2, PT3, PT4, PT5 and PT6 or polygons in the patches PA, PB, PC, PE, PF, PG, PI, PJ and PK may be loaded. The patch PF, which is selected as the target patch, is illustrated in FIG. 3 with bold solid lines. When the layout patterns PT1, PT3, and PT4 in the patch PF may be divided, all the layout patterns PT1, PT2, PT3, PT4, PT5 and PT6 in the patch PF and the neighboring patches PA, PB, PC, PE, PG, PI, PJ and PK may be considered. Thus, dissection discrepancy of the divided layout patterns PT1, PT3, and PT4 may be prevented or avoided.

Figure 4:
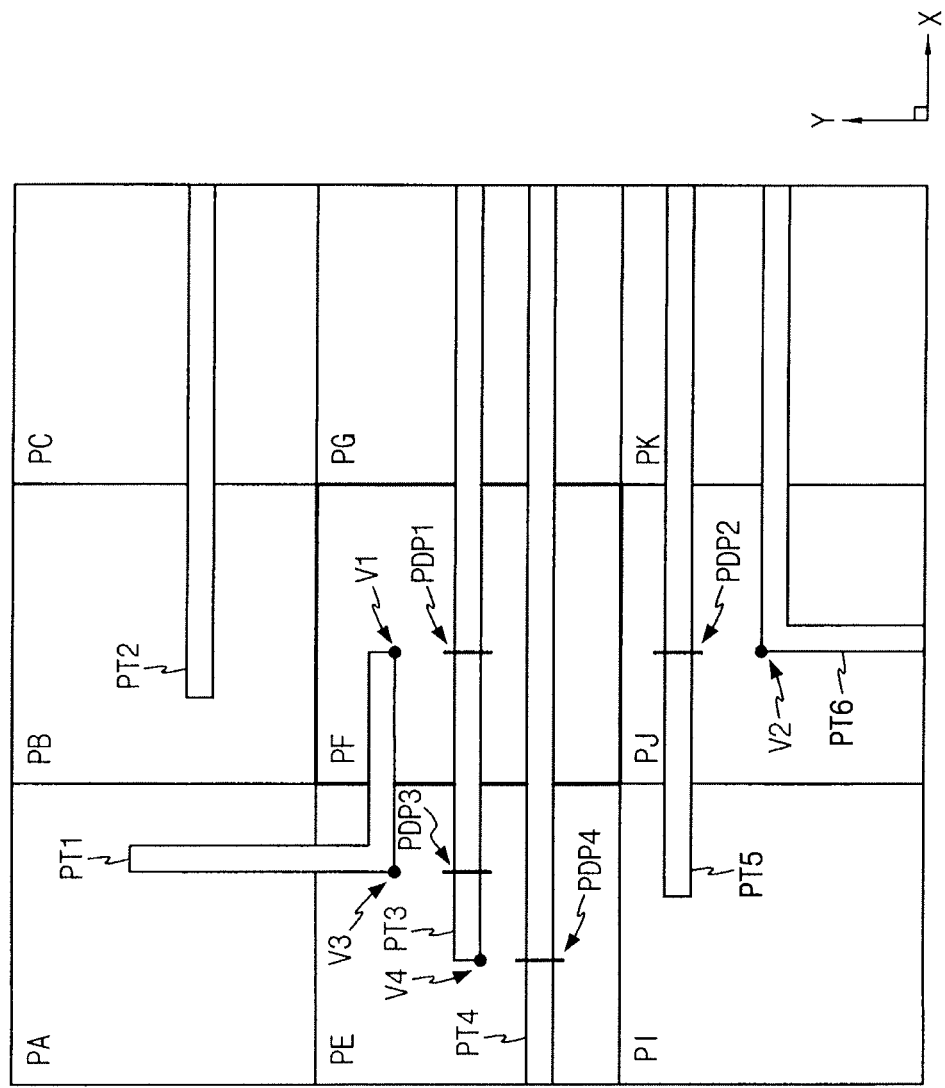
Figure 5:
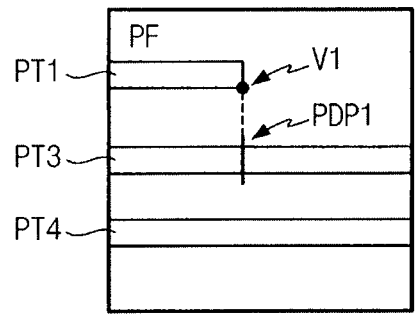

Referring to FIGS. 1, 4 and 5, as described with reference to step S300, a plurality of first dissection points PDP1, PDP2, PDP3 and PDP4 for the layout patterns PT1, PT2, PT3, PT4, PT5 and PT6 may be set or allocated based on vertexes V1, V2, V3, and V4 of the layout patterns PT1, PT3, and PT6.

For example, referring to FIG. 5, an intersection point of an edge (or a side) of the layout pattern PT3 and a first line (e.g., a dotted line in FIG. 5) may be set or allocated as the first dissection point PDP1 of the layout pattern PT3. The first line may extend from a vertex V1 of the layout pattern PT1 adjacent to the layout pattern PT3 to be perpendicular to the edge of the layout pattern PT3 in a Y direction. Further, a distance between the layout pattern PT3 and the layout pattern PT1 may be shorter than a predetermined reference distance.

When a distance between the layout pattern PT5 and the layout pattern PT6 is shorter than the predetermined reference distance, an intersection point of an edge of the layout pattern PT5 and a second line (not shown in FIG. 5) may be set or allocated as the first dissection point PDP2 of the layout pattern PT5. The second line may extend from a vertex V2 of the layout pattern PT6 to be perpendicular to the edge of the layout pattern PT5 in the Y direction. When the distance between the layout pattern PT3 and the layout pattern PT1 is shorter than the predetermined reference distance, an intersection point of an edge of the layout pattern PT3 and a third line (not shown in FIG. 5) may be set or allocated as the first dissection point PDP3 of the layout pattern PT3. The third line may extend from a vertex V3 of the layout pattern PT1 to be perpendicular to the edge of the layout pattern PT3 in the Y direction. When a distance between the layout pattern PT4 and the layout pattern PT3 is shorter than the predetermined reference distance, an intersection point of an edge of the layout pattern PT4 and a fourth line (not shown in FIG. 5) may be set or allocated as the first dissection point PDP4 of the layout pattern PT4. The fourth line may extend from a vertex V4 of the layout pattern PT3 to be perpendicular to the edge of the layout pattern PT4 in the Y direction.

In other words, each of the plurality of first dissection points PDP1~PDP4 may be set or allocated based on a perpendicular line projected on an edge of a specific layout pattern from a vertex of a neighboring layout pattern. The plurality of first dissection points PDP1~PDP4 may be referred to as projection dissection points.

When a distance between the layout pattern PT1 and the layout pattern PT2 is longer than the reference distance, the first dissection point for the layout pattern PT2 may not be set or allocated based on a vertex of the layout pattern PT1, and the first dissection point for the layout pattern PT1 may not be set or allocated based on a vertex of the layout pattern PT2. Further, when a distance between the layout pattern PT4 and the layout pattern PT5 is longer than the reference distance, the first dissection point for the layout pattern PT4 may not be set or allocated based on a vertex of the layout pattern PT5.

In some example embodiments, the reference distance may be changed based on a user setting signal.

FIGS. 4 and 5 illustrate an example that each of the plurality of first dissection points PDP1~PDP4 are set based on two layout patterns that are in the same patch and are close to each other, the example embodiment may not be limited thereto. For example, the first dissection point may be set or allocated based on two layout patterns that are included in different patches and are close to each other.

Figure 6:
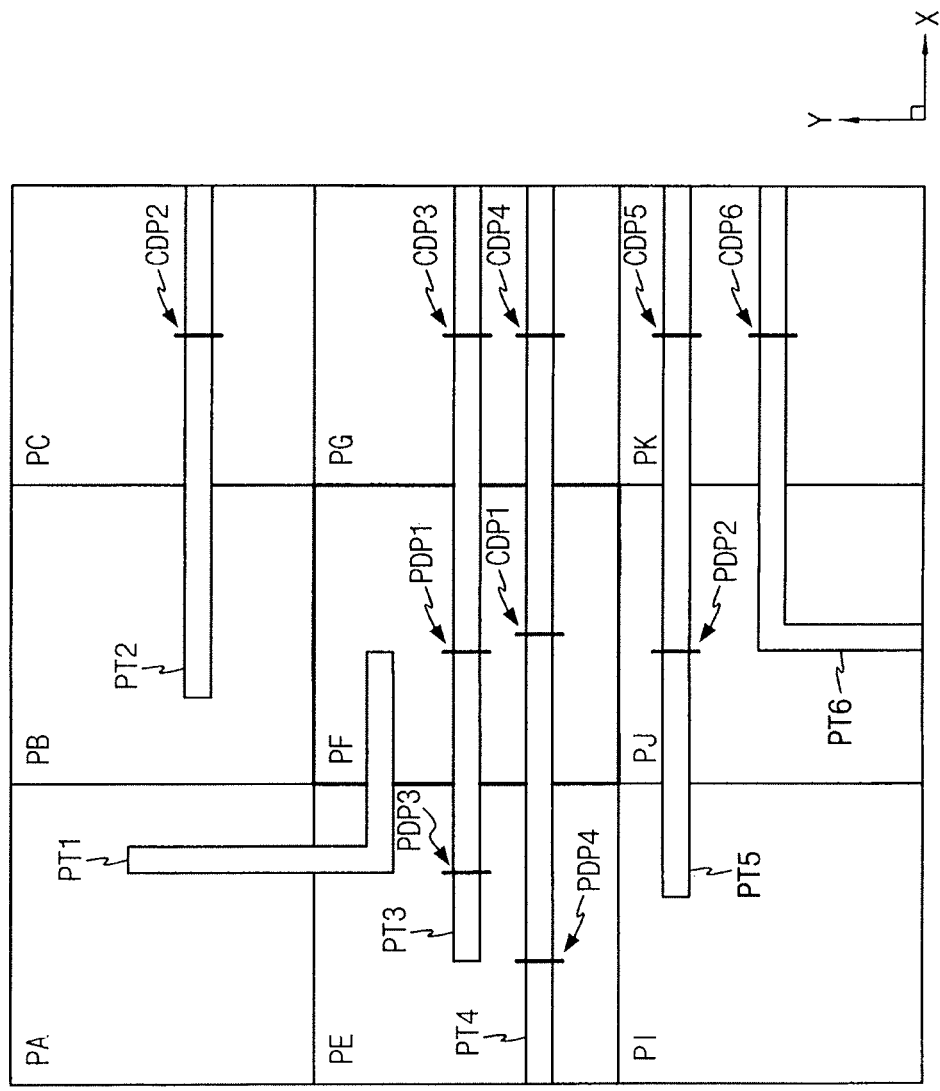

Referring to FIGS. 1, 4 and 6, as described with reference to step S400, a plurality of second dissection points CDP1, CDP2, CDP3, CDP4, CDP5 and CDP6 for the exceptional layout patterns PT2, PT3, PT4, PT5, and PT6 may be set or allocated.

For example, referring to FIG. 4, the layout pattern PT4 may have the first dissection point PDP4 in the patch PE, but the layout pattern PT4 may not have any dissection point in the patch PF. Further, the layout pattern PT4 may extend to pass through the patch PF, and may have both ends beyond boundaries of the patch PF. In other words, the layout pattern PT4 in the patch PF may be a layout pattern that does not have any first dissection point and has both ends overlapping the boundaries of the patch PF. Further, the layout pattern PT4 in the patch PF may be a long layout pattern having a length same as a length of the patch PF. The layout pattern P14 in the patch PF may not have positions of short edges as reference points for the pattern division in the patch PF. Thus, referring to FIG. 6, the second dissection point CDP1 for the layout pattern PT4 may be set in the patch PF.

For example, a center point of an edge of the layout pattern PT4 in the patch PF may be set or allocated as the second dissection point CDP1 on the layout pattern PT4. In other words, a distance between the second dissection point CDP1 and one boundary of the patch PF may be substantially equal to a distance between the second dissection point CDP1 and another boundary of the patch PF opposite to the one boundary of the patch PF.

Further, when the layout pattern PT2 extends to pass through the patch PC, the layout pattern PT2 in the patch PC may be an exceptional layout pattern with respect to the patch PC. When each of the layout patterns PT3 and PT4 extend to pass through the patch PG, each of the layout patterns PT3 and PT4 in the patch PG may be an exceptional layout pattern with respect to the patch PG. When each of the layout patterns PT5 and PT6 extend to pass through the patch PK, each of the layout patterns PT5 and PT6 in the patch PK may be an exceptional layout pattern with respect to the patch PK. A center point of an edge of the layout pattern PT2 in the patch PC may be set or allocated as the second dissection point CDP2 on the layout pattern PT2. A center point of an edge of the layout pattern PT3 in the patch PG may be set or allocated as the second dissection point CDP3 on the layout pattern PT3. A center point of an edge of the layout pattern PT4 in the patch PG may be set or allocated as the second dissection point CDP4 on the layout pattern PT4. A center point of an edge of the layout pattern PT5 in the patch PK may be set or allocated as the second dissection point CDP5 on the layout pattern PT5. A center point of an edge of the layout pattern PT6 in the patch PK may be set or allocated as the second dissection point CDP6 on the layout pattern PT6.

In other words, when a specific layout pattern is an exceptional layout pattern with respect to a specific patch, each of the plurality of second dissection points CDP1~CDP6 for the exceptional layout pattern, may be additionally set or allocated as a reference point for the pattern division. In addition, a center point of an edge of the exceptional layout pattern may be set or allocated as each of the plurality of second dissection points CDP1~CDP6 to reduce or minimize the number of added dissection points. The plurality of second dissection points CDP1~CDP6 may be referred to as center dissection points.

Further to the above, the layout pattern PT4 in the patch PE may not be an exceptional layout pattern with respect to the patch PE, because the first dissection point PDP4 for the layout pattern PT4 is set or allocated in the patch PE regardless of whether the layout pattern PT4 extends to pass through boundaries of the patch PE. Thus, an additional second dissection point for the layout pattern PT4 may not be set or allocated in the patch PE. Further, the layout pattern PT5 in the patch PJ may not be an exceptional layout pattern with respect to the patch PJ, because the first dissection point PDP2 for the layout pattern. PT5 is set in the patch PJ regardless of whether the layout pattern PT5 extends to pass through boundaries of the patch PJ. Thus, an additional second dissection point for the layout pattern PT5 may not be set or allocated in the patch PJ.

In some example embodiments, a length of an exceptional layout pattern may be longer than a length of an edge of one patch.

Figure 7:
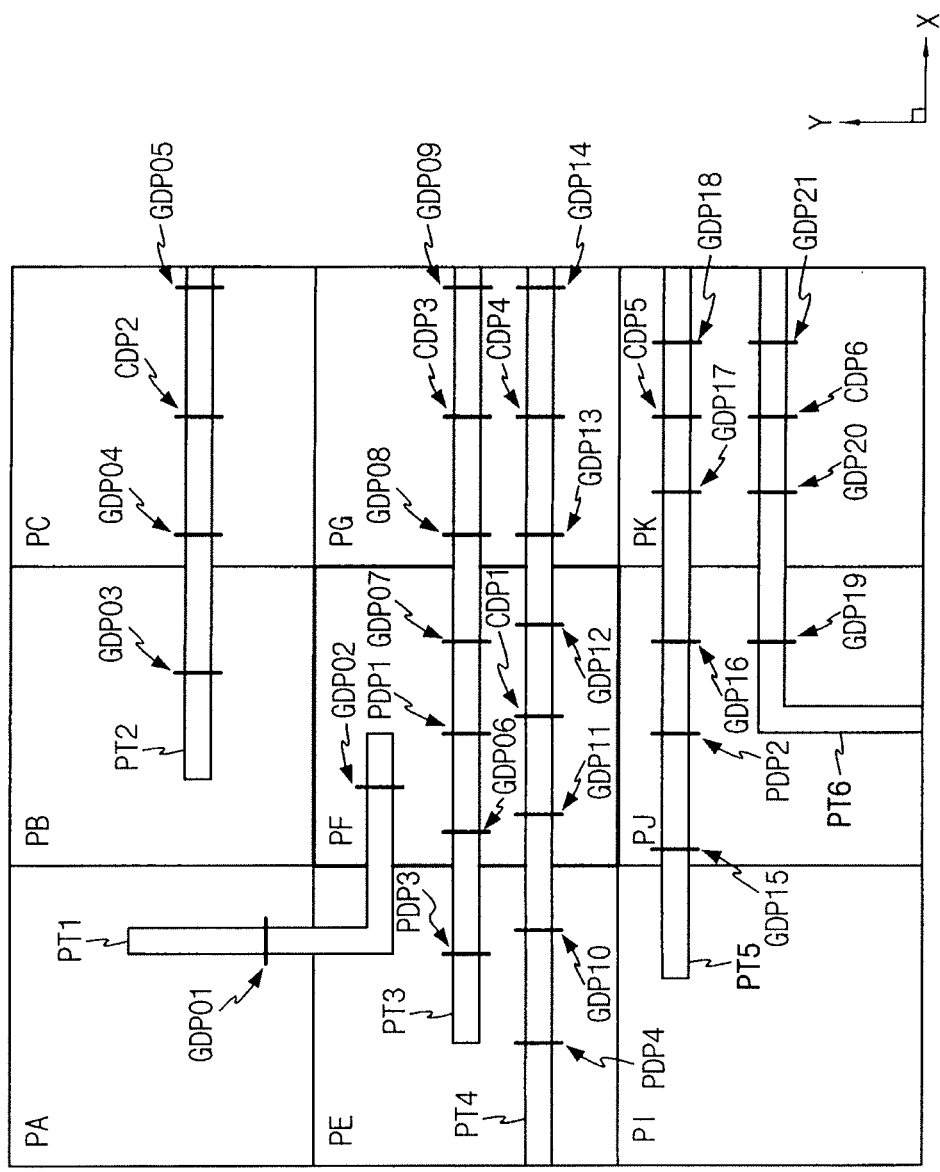

Referring to FIGS. 1, 6 and 7, as described with reference to step S500, a plurality of third dissection points GDP01, GDP02, GDP03, GDP04, GDP05, GDP06, GDP07, GDP08, GDP09, GDP10, GDP11, GDP12, GDP13, GDP14. GDP15, GDP16, GDP17, GDP18, GDP19, GDP20 and GDP21 for the layout patterns PT1. PT2, PT3, PT4, PT5 and PT6 may be set or allocated based on the plurality of first dissection points PDP1~PDP4 and the plurality of second dissection points CDP1~CDP6.

For example, the third dissection point GDP06 may be set or allocated on the layout pattern PT3 between the first dissection points PDP1 and PDP3 adjacent to each other. The third dissection point GDP06 may be a center point between the first dissection points PDP1 and PDP3. The third dissection points GDP07 and GDP08 may be set or allocated on the layout pattern PT3 between the first and second dissection points PDP1 and CDP3 adjacent to each other. A distance between the third dissection point GDP07 and the first dissection point PDP1 is same as a distance between the the third dissection point GDP08 and the second dissection point CDP3. The third dissection points GDP03 and GDP04 may be set or allocated on the layout pattern PT2 between one short edge of the layout pattern PT2 and the second dissection point CDP2 adjacent to each other. A distance between the third dissection point GDP03 and the one short edge of the layout pattern PT2 is same as a distance between the the third dissection point GDP04 and the second dissection point CDP2. The third dissection points GDP01 and GDP02 may be set and allocated on the layout pattern PT1 between two short edges of the layout pattern PT1. Each of the plurality of third dissection points DP01~GDP21 may be set or allocated in a similar way.

FIG. 7 illustrates an example that one or two of the plurality of third dissection points GDP01~GDP21 may be set or allocated between two adjacent dissection points among the first and second dissection points PDP1~PDP4 and CDP1~CDP6 or between one short edge of each layout pattern and one of the first and second dissection points PDP1~PDP4 and CDP1~CDP6, the example embodiment may not be limited thereto. For example, a method for setting the plurality of third dissection points may be changed according to example embodiments.

In addition, FIG. 7 illustrates an example that the layout pattern PT3 is divided into segments having the same length by the third dissection points GDP07 and GDP08 disposed between the first and second dissection points PDP1 and CDP3, the example embodiment may not be limited thereto. For example, a length of each segment may be changed according to example embodiments.

As described with reference to step S600, the target layout patterns in the target patch may be divided into the plurality of target segments. For example, the layout patterns PT1, PT3 and PT4 in the patch PF may be divided into the plurality of target segments based on the dissection points PDP1, CDP1, GDP02, GDP06, GDP07, GDP11 and GDP12 in the patch PF. One segment may be a portion of one edge of one layout pattern. Further, the rest or remainder of the dissection points PDP2, PDP3, PDP4, CDP2, CDP3, CDP4, CDP5, CDP6, GDP01, GDP02, GDP03, GDP04, GDP05, GDP08, GDP09, GDP10, GDP13, GDP14, GDP15, GDP16, GDP17, GDP18, GDP19, GDP20 and GDP21 in the patches PA, PB, PC, PE, PG, PI, PJ and PK (e.g., the neighboring patches) may be used only for obtaining the dissection points PDP1, CDP1, GDP02, GDP06, GDP07, GDP11 and GDP12 in the patch PF (e.g., the target patch), and may not be used for obtaining the plurality of target segments or may not be output as a result of the pattern division.

The plurality of target segments and the optical proximity correction process performed with the plurality of target segments will be described with reference to FIGS. 10 through 14.

Figure 8:
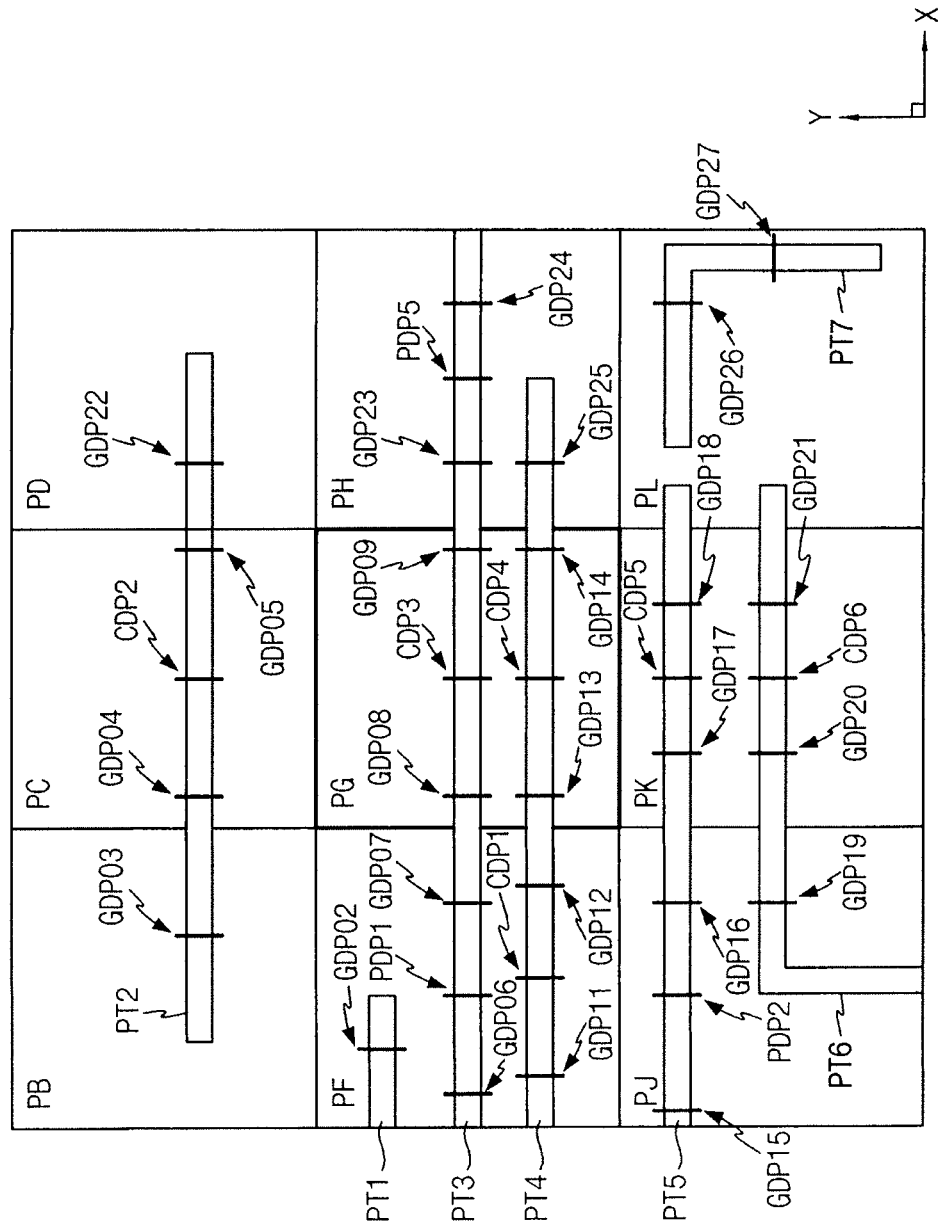

Referring to FIGS. 1 and 8, in a first optical proximity correction process, the patch PF may be selected as the target patch, and steps S300 through S600 may be performed based on the selected patch PF. In a second optical proximity correction process, the patch PG may be selected as the target patch, and the eight patches PB, PC, PD, PF, PH, PJ, PK and PL surrounding the patch PG may be selected as the plurality of neighboring patches, and steps S300 through S600 may be performed based on the selected patch PG and the selected eight patches PB, PC, PD, PF, PH, PJ, PK and PL. The patch PG selected as the target patch is emphasized in FIG. 8 with bold solid lines.

For example, referring to FIGS. 4 through 7, a plurality of first dissection points PDP1, PDP2 and PDP5, a plurality of second dissection points CDP1, CDP2, CDP3, CDP4, CDP5 and CDP6, and a plurality of third dissection points GDP02, GDP03, GDP04, GDP05, GDP06, GDP07, GDP08, GDP09, GDP11, GDP12, GDP13, GDP14, GDP15, GDP16, GDP17, GDP18, GDP19, GDP20, GDP21, GDP22, GDP23, GDP24, GDP25, GDP26 and GDP27 for the layout patterns PT1, PT2, PT3, PT4, PT5, PT6 and PT7 in the patches PB, PC, PD, PF, PG, PH, PJ, PK and PL may be sequentially set or allocated. After that, the layout patterns PT3 and PT4 in the patch PG may be divided into the plurality of target segments based on the dissection points CDP3, CDP4, GDP08, GDP09, GDP13 and GDP14 in the patch PG.

In some example embodiments, a first division result performed with selecting the patch PF as the target patch may be substantially the same as or matched with a second division result performed with selecting the patch PG as the target patch. For example, referring to FIG. 7 illustrating the first division result and FIG. 8 illustrating the second division result, positions of the dissection points PDP1, PDP2, CDP1, CDP2, CDP3, CDP4, CDP5, CDP6, GDP02, GDP03, GDP04, GDP05, GDP06, GDP07, GDP08, GDP09, GDP11, GDP12, GDP13, GDP14, GDP15, GDP16, GDP17, GDP18, GDP19, GDP20 and GDP21 in the patches PB, PC, PF, PG, PJ and PK that are commonly illustrated in FIGS. 7 and 8 may be substantially the same as each other in FIGS. 7 and 8. In particular, positions of the first and second dissection points PDP1, PDP2, CDP1, CDP2, CDP3, CDP4, CDP5 and CDP6 may be substantially the same as each other in FIGS. 7 and 8.

In some example embodiments, referring to FIGS. 4 through 8, a plurality of dissection points in one layout pattern may be set or allocated on the same positions of both edges of the one layout pattern facing each other. For example, the dissection points PDP1, GDP06 and GDP07 for the layout pattern PT3 in the patch PF may be set or allocated on the opposite positions of an upper edge and a lower edge of the layout pattern PT3. In other words, a method for setting the dissection points may be performed with units of polygon. e.g., with units of a pair of edges that are included in one polygon and opposite to each other.

When the optical proximity correction process is performed, one whole design layout may be divided into the plurality of patches, the optical proximity correction process may be performed with units of patches, and results of the optical proximity correction process for all the plurality of patches may be merged to obtain the entire corrected design layout corresponding to the entire design layout. As the optical proximity correction process is independently performed on each of the plurality of patches, division results may be different from boundaries of neighboring patches, and thus unwanted or undesired errors, e.g., jog, notch, nub, etc. may be caused.

In the dissection method for layout patterns in the semiconductor device according to example embodiments, the target patch (e.g., PF) and the plurality of neighboring patches (e.g., PA, PB, PC, PE, PG, PI, PJ and PK) surrounding the target patch may be selected. The first dissection points (e.g., PDP1~PDP4) for the layout patterns (e.g., PT1~PT6) in the target patch and the neighboring patches may be set or allocated, and the second dissection points (e.g., CDP1~CDP6) for the exceptional layout patterns may be additionally set or allocated. When the second dissection points (e.g., CDP1~CDP6) are intentionally set or allocated on the exceptional layout patterns, the division results for all the plurality of patches may be substantially the same as or matched with each other. Thus, the dissection discrepancy between two or more adjacent patches may be prevented or avoided. In addition, the center point on the edge of the exceptional layout pattern may be set to the second dissection point, and thus side effects from the intentional or artificial divisions may be reduced or minimized.

Figure 9:
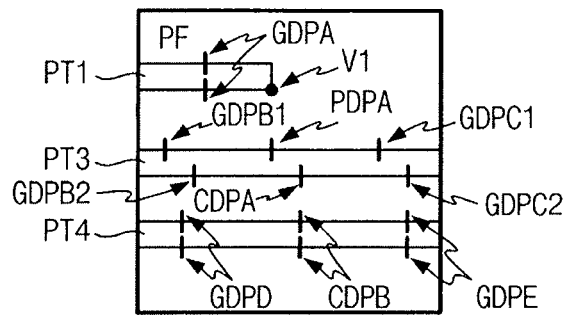

Referring to FIG. 9, a plurality of dissection points PDPA, CDPA, CDPB, GDPA, GDPB1, GDPB2, GDPC1, GDPC2, GDPD and GDPE for the layout patterns PT1, PT3 and P14 in the patch PF as the target patch may be set or allocated based on the dissection method similar to the methods described with reference to FIGS. 2 through 7.

In some example embodiments, referring to FIG. 9, a plurality of dissection points in one layout pattern may be set or allocated on different positions of both edges of the one layout pattern that do not face each other. For example, the dissection points PDPA, CDPA, GDPB1, GDPB2, GDPC1 and GDPC2 for the layout pattern PT3 in the patch PF may be set or allocated on different positions of an upper edge and a lower edge of the layout pattern PT3. The first dissection point PDPA may be set or allocated on the upper edge of the layout pattern PT3 based on the vertex V1 of the layout pattern PT1. In other words, the first dissection point PDPA and the vertex V1 of the layout pattern PT1 face each other in the Y direction. The second dissection point CDPA may be set or allocated on the lower edge of the layout pattern PT3. The third dissection points GDPB1 and GDPC1 may be set or allocated based on the first dissection point PDPA. For example, the first dissection point PDPA may be located at a center point between the third dissection points GDPB1 and GDPC1. The third dissection points GDPB2 and GDPC2 may be set or allocated based on the second dissection point CDPA. For example, the second dissection point CDPA may be located at a center point between third dissection points GDPB2 and GDPC2. In other words, a method for setting the dissection points may be performed with units of edge, e.g., with units of a single edge of each polygon.

Figure 10:
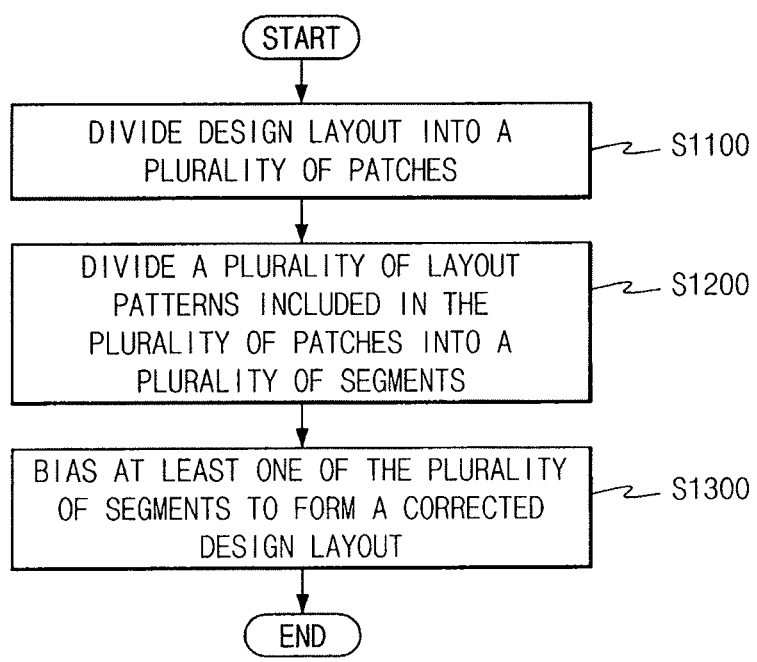
FIG. 10 illustrates a flowchart of an optical proximity correction method according to an example embodiment.

FIG. 10 is a flowchart of an optical proximity correction method according to example embodiments.

Referring to FIG. 10, in an optical proximity correction method according to example embodiments, a design layout for a target layer, on which an optical proximity correction process is performed, divided into a plurality of patches (step S1100). Step S1100 may be substantially the same as step S100 in FIG. 1.

A plurality of layout patterns in the plurality of patches are divided into a plurality of segments (step S1200). Step S1200 may be performed based on the dissection method for layout patterns in the semiconductor device described with reference to FIGS. 1 through 9. For example, step S1200 may include steps S200 through S600 in FIG. 1, and steps S200 through S600 may be repeatedly or recursively performed with selecting each of the plurality of patches as the target patch.

At least one of the plurality of segments is biased or shifted to obtain a corrected design layout (step S1300). For example, a first segment among the plurality of segments may be biased or shifted in a first direction (e.g., an outward direction), and a second segment among the plurality of segments may be biased or shifted in a second direction (e.g., an inward direction) different from the first direction. A method for biasing or shifting the at least one of the plurality of segments will be described in detail with reference to FIG. 13.

In some example embodiments, steps S1200 and S1300 may be independently performed on each of the plurality of patches, and results of the optical proximity correction process for all the plurality of patches may be merged to obtain the entire corrected design layout corresponding to the entire design layout.

A resolution enhancement technology may be used for preventing the distortion of the layout. The optical proximity correction process is an example of a resolution enhancement technology. The plurality of layout patterns that are included in the design layout and obtained by the layout design process may be implemented or realized on a silicon substrate by a photolithography process. The optical proximity correction process may be performed to correct an optical proximity effect that may occur in the photolithography process. The optical proximity effect may be an unintended optical effect (e.g., refraction or diffraction) which may occur in the photolithography process. For example, a distortion phenomenon of layout patterns, which may be caused by the optical proximity effect, may be corrected by the optical proximity correction process. The designed shapes and positions of the designed layout patterns may be slightly changed or biased by the optical proximity correction process.

FIGS. 11 through 14 are diagrams of an optical proximity correction method according to example embodiments.

Figure 11:
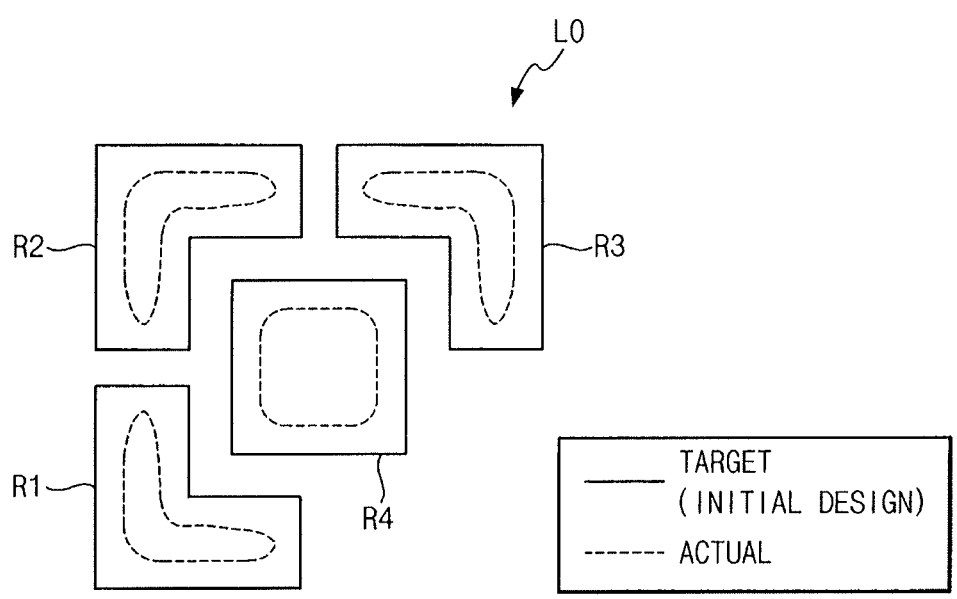

Referring to FIG. 11, a design layout LO may include a first circuit pattern R1, a second circuit pattern R2, a third circuit pattern R3, and a fourth circuit pattern R4. The first through fourth circuit patterns R1~R4 may correspond to the plurality of layout patterns PT1~PT7 described with reference to FIGS. 2 through 9. The number of circuit patterns and a shape or form of the design layout LO in FIG. 11 is an example, the example embodiment may not be limited thereto.

In some example embodiments, solid lines of the first through fourth circuit patterns R1~R4 in FIG. 11 may be a desired layout and may show a layout to be printed or implemented onto a substrate. The desired layout may be an initial design layout. For example, solid lines in FIG. 11 may correspond to a target layout. The target layout may be an initial/original design layout. For example, a semiconductor designer may provide the target layout corresponding to the solid lines of the design layout LO for printing on the substrate (e.g., a wafer).

However, the photolithography process may cause distortion, e.g., optical interference and optical diffraction. When the photolithography process is performed with image patterns corresponding to the solid lines in FIG. 11, the first through fourth circuit patterns R1~R4 may be actually implemented or realized along dotted lines in FIG. 11 on the substrate due to the distortion. Referring to FIG. 11, the dimensions and shapes of the image patterns actually printed on the substrate (as shown by the dotted lines) can be different from the dimensions and shapes that are desired or intended to be printed on the substrate (as shown by the solid lines). When a distorted layout corresponding to the dotted lines in FIG. 11 is printed on the substrate, a designed circuit may operate abnormally or in a manner different from its intended purpose.

The optical proximity correction process may be performed to prevent the distortion of the implemented layout. In the optical proximity correction process, the design layout may be biased or shifted to reduce an error between the real/implemented layout and the desired layout. For example, a design layout including biased/shifted patterns may reduce differences in shape and dimension between the desired layout and the real printed layout. The biasing/shifting may be performed based on predicted distortion caused by optical interference and optical diffraction. When the photolithography process is performed based on image patterns corresponding to the biased/shifted design layout, the implemented layout formed by the photolithography process may be substantially same as the initial design layout (e.g., the desired layout). In other words, the implemented layout formed with the biased/shifted design layout may have a smaller error (or within an acceptable threshold of differences) than the implemented layout formed with the initial design layout.

Figure 12:
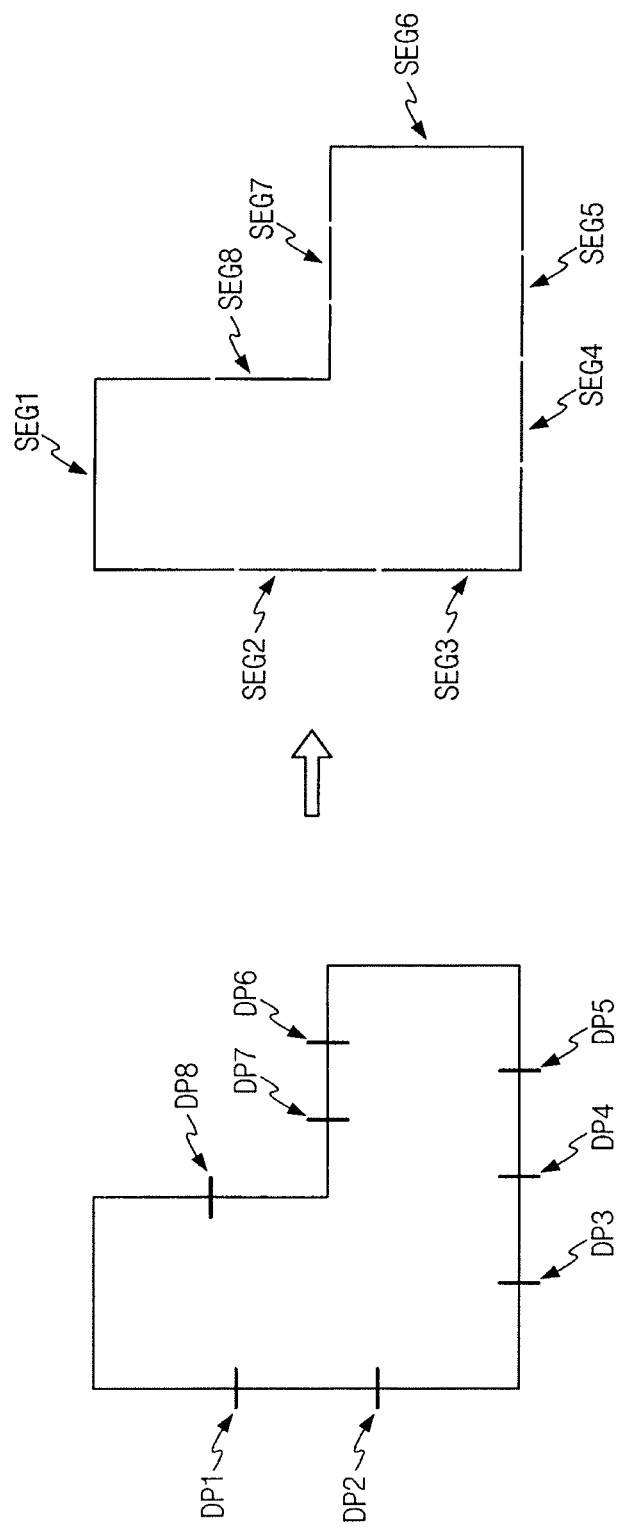

Referring to FIGS. 10, 11 and 12, as described with reference to step S1200, each layout pattern may be divided into a plurality of segments.

For example, referring to FIG. 12, a plurality of dissection points DP1, DP2, DP3, DP4, DP5, DP6, DP7 and DP8 may be set or allocated on a contour of the first circuit pattern R1 of the design layout LO. For example, the plurality of dissection points DP1, DP2, DP3, DP4, DP5, DP6, DP7 and DP8 may be located along outline or perimeter of the first circuit pattern R1 of the design layout LO.

The plurality of dissection points DP1~DP8 may be set or allocated based on the dissection method for layout patterns in the semiconductor device described with reference to FIGS. 1 through 9. For example, the target patch and the neighboring patches may be selected. The first dissection points may be set or allocated based on the vertexes of the layout patterns. The second dissection point for the exceptional layout pattern may be intentionally set or allocated. The third dissection points may be set based on the first and second dissection points. Thus, the dissection discrepancy between the target patch and the neighboring patches may be prevented or avoided.

The contour of the first circuit pattern R1 may be divided into a plurality of segments SEG1, SEG2, SEG3, SEG4, SEG5, SEG6, SEG7 and SEG8 based on the plurality of dissection points DP1~DP8. For example, the segment SEG1 may be obtained based on the dissection points DP1 and DP8.

Figure 13:
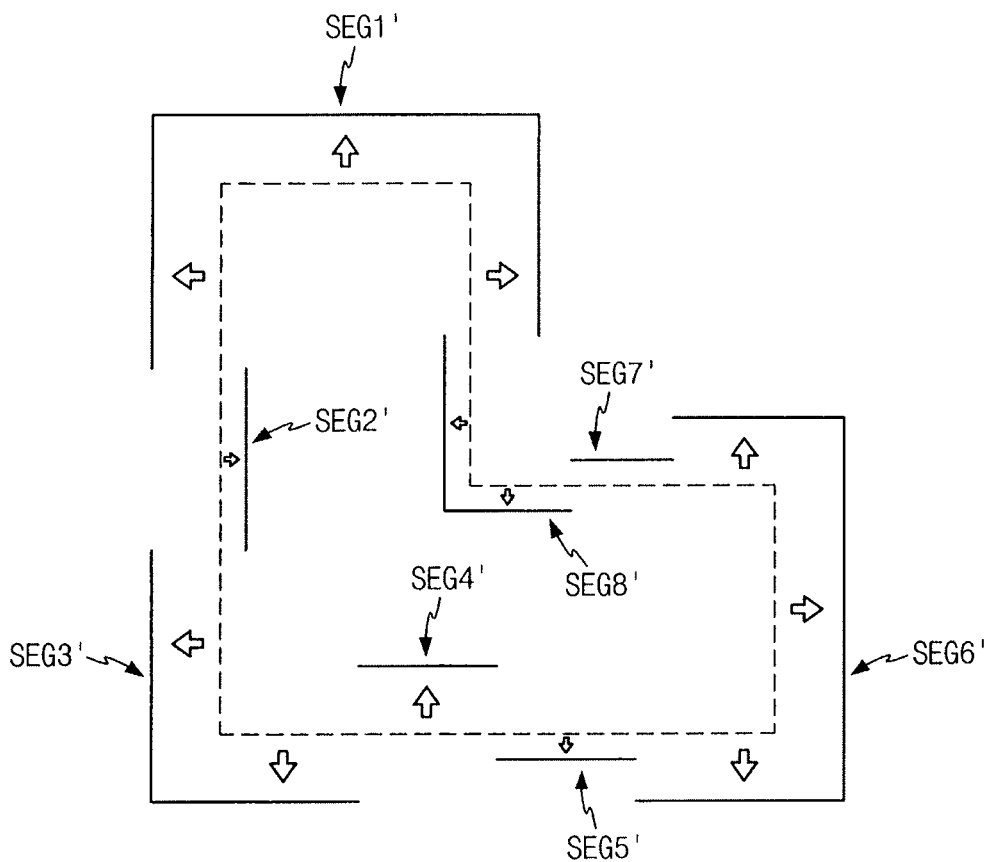

Referring to FIGS. 10, 12 and 13, as described with reference to step S1300, at least one of the plurality of segments SEG1~SEG8 may be biased or shifted. For example, each of the plurality of segments SEG1~SEG8 may be compensated to reduce distortion of the implemented layout.

Each of the plurality of segments SEG1~SEG8 may be independently and/or differently biased or shifted. For example, one segment may be biased or shifted in a first direction (e.g., a positive direction, an outward direction) or a second direction (e.g., a negative direction, an inward direction), independently of other segments. Referring to FIG. 13, the segments SEG1, SEG3, SEG5, SEG6 and SEG7 may be biased or shifted in the first direction (e.g., the outward direction) to obtain biased segments SEG1', SEG3', SEG5', SEG6' and SEG7', and the segments SEG2, SEG4 and SEG8 may be biased or shifted in the second direction (e.g., the inward direction) to obtain biased segments SEG2', SEG4' and SEG8'. The biasing/shifting of the segments may include, for example, moving the outside edges corresponding to the segments SEG1', SEG3', in one of the first direction or the second direction. Each of the plurality of segments SEG1~SEG8 may be biased or shifted to reduce an error between a real/implemented layout and the desired layout. For example, a certain segment may not be biased or shifted in either of the first direction or the second direction.

Referring to FIGS. 10, 13 and 14, as described with reference to step S1300, the corrected design layout may be formed based on the biased segments SEG1'~SEG8'.

For example, a first corrected pattern R1' may be obtained by correcting the first circuit pattern R1 in the design layout L0 of FIG. 11. As described above, the contour of the first circuit pattern R1 may be divided into a plurality of segments, one or more of the plurality of segments may be biased or shifted, and thus the first corrected pattern R1' may be obtained. For example, the corrected design layout including the first corrected pattern R1' may be obtained.

Referring to FIG. 14, when an actual, real, or physical layout is printed on the substrate with the corrected design layout (e.g., updated layout) including the first corrected pattern R1', the actual, real, or physical layout may be approximately same as the desired layout (e.g., the initial design layout), and thus an error between the actual, real, or physical layout and the desired layout may be reduced.

FIGS. 12 through 14 illustrate an example having the first circuit pattern R1 and the first corrected pattern R1' corresponding to the first circuit pattern R1, and the example embodiment is not limited thereto. For example, second through fourth corrected patterns corresponding to the second through fourth circuit patterns R2~R4 may be obtained, and the corrected design layout including the second through fourth corrected patterns may be obtained in a similar way.

Figure 15:
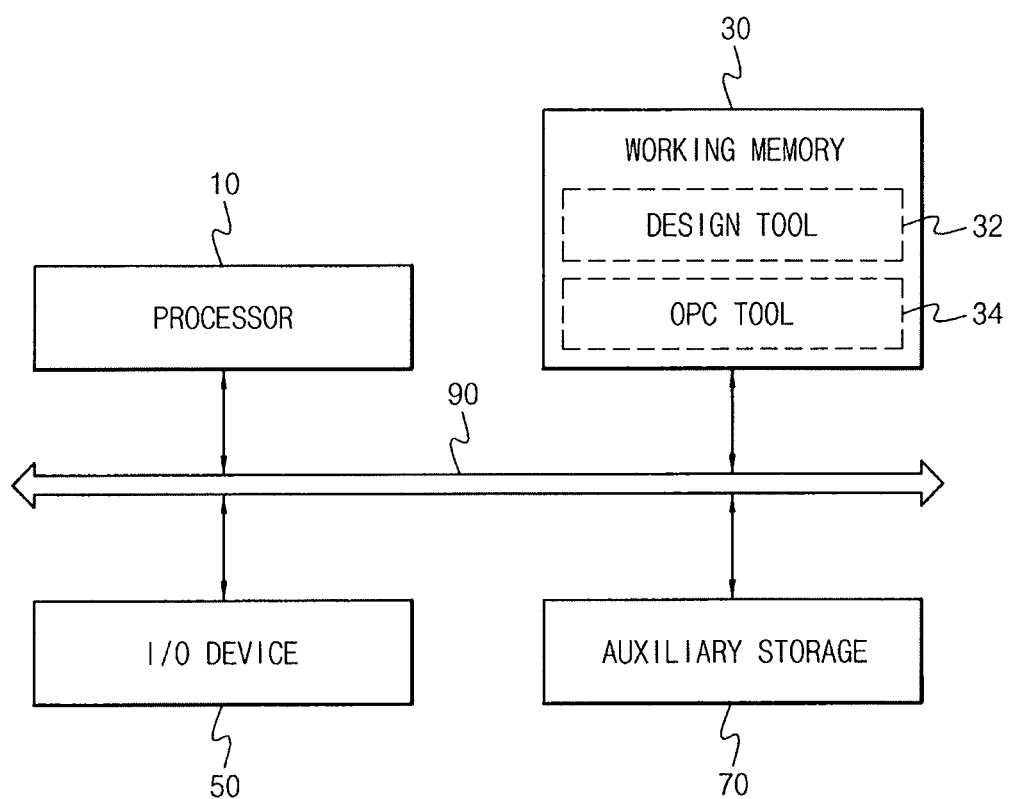
FIG. 15 illustrates a block diagram of a computing system that performs a dissection method and an optical proximity correction method according to an example embodiment.

FIG. 15 is a block diagram of a computing system that performs a dissection method and an optical proximity correction method according to example embodiments.

Referring to FIG. 15, a computing system includes a processor 10, a working memory 30, an input/output (I/O) device 50, an auxiliary storage 70 and a system interconnector 90. For example, the computing system may be a customized system for performing the dissection method, the optical proximity correction method according to example embodiments, and a semiconductor design process including the dissection method and/or the optical proximity correction method. For example, the computing system may be configured to execute various design and check simulation programs.

The processor 10 may be configured to execute or run a variety of software (e.g., application programs, operating systems, device drivers, etc.) in the computing system. For example, the processor 10 may be configured to execute or run an operating system (OS) loaded on the working memory 30. In addition, the processor 10 may be configured to execute or run various application programs on the operating system. For example, the processor 10 may include at least one of various processing elements, e.g., a central processing unit (CPU), a microprocessor, an application processor (AP), etc.

The operating system or the application programs may be loaded on the working memory 30. For example, when the computing system starts a booting operation, an OS image stored in the auxiliary storage 70 may be loaded on the working memory 30 according to a booting sequence. In the computing system, overall input/output operations may be managed by the operating system. For example, some application programs, which may be selected by a user or be provided for basic services, may be loaded on the working memory 30. For example, a design tool 32 prepared for the semiconductor design process and/or an OPC tool 34 prepared for the dissection method and the optical proximity correction method according to example embodiments may be loaded from the auxiliary storage 70 onto the working memory 30.

The design tool 32 may perform a bias function for changing or modifying shapes and positions of specific layout patterns according to a semiconductor design rule. For example, the design tool 32 may perform a design rule check (DRC) under the changed condition obtained by the bias function. The working memory 30 may include at least one volatile memory, e.g., a dynamic random access memory (DRAM), a synchronous DRAM (SDRAM), a static random access memory (SRAM), etc., and/or at least one nonvolatile memory, e.g., an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), or a polymer random access memory (PoRAM), etc.

The I/O device 50 may control input and output operations of user interface devices. For example, the I/O device 50 may include input devices, e.g., a keyboard, a keypad, a mouse, a touch screen, etc. and may receive relevant information from a designer. By using the I/O device 50, the designer may receive information on semiconductor regions or data paths which require adjusted operating characteristics. In addition, the I/O device 50 may include output devices, e.g., a printer, a display, etc. and may display a progress status or a process result of the design tool 32 and/or the OPC tool 34.

The auxiliary storage 70 may serve as a storage medium for the computing system. The auxiliary storage 70 may store the application programs, the OS image, and various data. The auxiliary storage 70 may be at least one of a memory card (e.g., MMC, eMMC, SD, MicroSD, etc.), a hard disk drive (HDD), a solid state drive (SSD), a UFS (universal flash storage), etc. having a large memory capacity.

The system interconnector 90 may serve as a system bus for realizing a network in the computing system. The processor 10, the working memory 30, the I/O device 50, and the auxiliary storage 70 may be electrically connected to each other through the system interconnector 90, and thus data may be exchanged therebetween. The system interconnector 90 may not be limited to the aforementioned configuration. In some example embodiments, the system interconnector 90 may further include an additional element for increasing efficiency in data communication.

Figure 16:
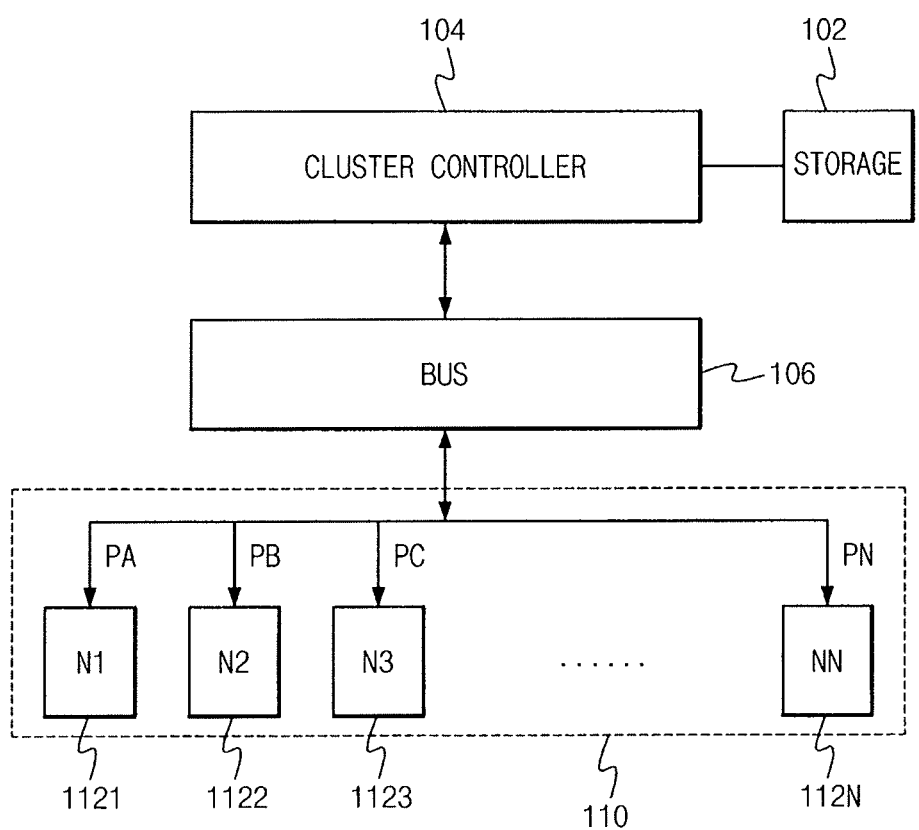
FIG. 16 illustrates a block diagram of an optical proximity correction (OPC) tool that performs a dissection method and an optical proximity correction (OPC) method according to an example embodiment.

FIG. 16 is a block diagram of an OPC tool that performs a dissection method and an optical proximity correction method according to example embodiments.

Referring to FIG. 16, an OPC tool 34 may include a data storage 102, a cluster controller 104, a bus 106 and a processing system 110.

The processing system 110 may include a plurality of nodes (N1, N2, N3, . . . , NN) 1121, 1122, 1123, . . . , 112N where N is a natural number. In some example embodiments, the plurality of nodes 1121~112N may include a plurality of processor cores for processing data. In some example embodiments, the plurality of nodes 1121~112N may include modules and/or functions in software. In some example embodiments, the plurality of nodes 1121~112N may include specific circuits for performing the OPC process.

The design layout may be divided into a plurality of patches PA, PB, PC, . . . , PN by using the OPC tool 34. For example, a design hierarchy may be read out from the layout design data provided from the data storage 102 by using the OPC tool 34, and the read design hierarchy may be analyzed by the OPC tool 34. Thereafter, the design layout may be divided into the plurality of patches PA~PN according to a unit element or proximity environment/effect. The plurality of patches PA~PN may have sizes of the plurality of nodes 1121~112N of the OPC tool 34, respectively. For example, each of the plurality of patches PA~PN may be a standard unit for performing the optical proximity correction process.

In some example embodiments, a division criterion of the plurality of patches PA~PN may include geometric information in each of the plurality of patches PA~PN, e.g., two-dimensional data, e.g., a polygonal shape of a circuit pattern, a length of an edge of the circuit pattern, a direction of the circuit pattern, a size of the circuit pattern, and/or a ratio of a space to a circuit pattern portion.

In some example embodiments, each of the plurality of patches PA~PN may have a quadrilateral region. A size of the quadrilateral region may be set by a user. Compared to FIG. 2, the plurality of patches PA~PN may have shapes different from each other and sizes different from each other. In some example embodiments, each of the plurality of patches PA~PN may define one region of circuit patterns to be printed or implemented on a substrate. The one region of the substrate may be a quadrilateral region. A length of one edge of the quadrilateral region may range from about 1 μm to about 99 μm. In some example embodiments, this size may be changed according to a set value of the user, as described above.

The plurality of patches PA~PN may be provided from the cluster controller 104 to the plurality of nodes 1121~112N of the processing system 110 through the bus 106, respectively. The optical proximity correction process may be performed dependently and in parallel on the plurality of patches PA~PN by using the plurality of nodes 1121~112N. Thus, a turnaround time (TAT) necessary to perform the optical proximity correction process may be reduced.

In some example embodiments, at least a part of the OPC tool 34 may be implemented in hardware. For example, at least a part of elements in the OPC tool 34 may be included in a computer-based electronic system. In some example embodiments, at least a part of the OPC tool 34 may be implemented in instruction codes or program routines (e.g., a software program). For example, the instruction codes or the program routines may be executed by a computer-based electronic system, and may be stored in storage devices located inside or outside the computer-based electronic system.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 17:
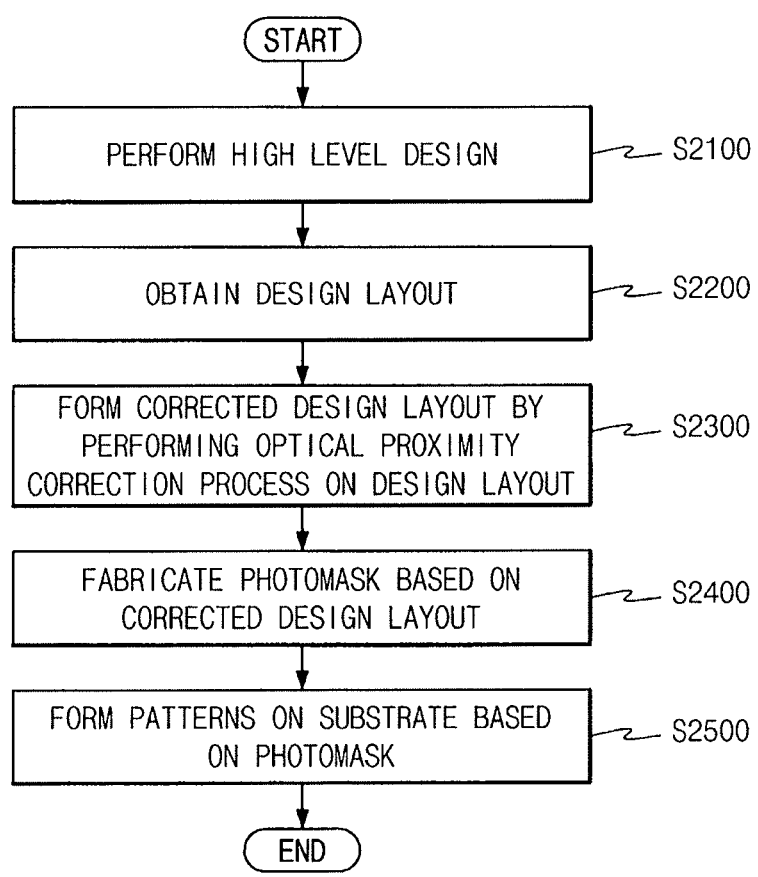
FIG. 17 illustrates a flowchart of a method for manufacturing a semiconductor device according to an example embodiment.

FIG. 17 is a flowchart of a method for manufacturing a semiconductor device according to example embodiments.

Referring to FIG. 17, in a method for manufacturing a semiconductor device according to example embodiments, a high-level design process of the semiconductor device is performed (step S2100). For example, in the high-level design process, an integrated circuit to be designed may be described in terms of high-level computer language (e.g., C language). Circuits designed by the high-level design process may be more concretely described by a register transfer level (RTL) coding or a simulation. In addition, codes generated by the RTL coding may be converted into a netlist, and the results may be combined with each other to realize an entire semiconductor device. The combined schematic circuit may be verified by a simulation tool. In some example embodiments, an adjusting operation may be further performed in consideration of a result of the verification operation.

A design layout for a layer in the semiconductor device is obtained (step S2200). In other words, a layout design process may be performed to implement or realize a semiconductor device on a silicon substrate. For example, the layout design process may be performed based on the schematic circuit generated in the high-level design process or the netlist corresponding thereto. The layout design process may include a routing operation of placing and connecting various standard cells that are provided from a cell library, based on a predetermined design rule.

A cell library for the layout design process may contain information on operation, speed, and power consumption of the standard cells. In some example embodiments, the cell library for representing a layout of a circuit having a specific gate level may be defined in a layout design tool (e.g., the design tool 32 in FIG. 15). Here, the layout may be prepared to define or describe shapes and sizes of patterns constituting transistors and metal interconnection lines, which may be actually implemented or formed on a silicon substrate. For example, layout patterns (e.g., PMOS, NMOS, N-WELL, gate electrodes, and metal interconnection lines thereon) may be suitably disposed to actually form an inverter circuit on a silicon substrate. For this, at least one of inverters defined in the cell library may be selected.

In addition, the routing operation may be performed on selected and disposed standard cells. In detail, the routing operation may be performed on the selected and disposed standard cells to connect them to upper interconnection lines. By the routing operation, the standard cells may be electrically connected to each other to meet a design. These operations (e.g., steps S2100 and S2200) may be automatically or manually performed in the layout design tool. In some example embodiments, an operation of placing and routing the standard cells may be automatically performed by an additional place & routing tool.

After the routing operation, a verification operation may be performed on the layout to check whether there is a portion violating the given design rule. In some example embodiments, the verification operation may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

A corrected design layout is formed by performing an optical proximity correction process on the design layout (step S2300). Step S2300 may be performed based on the optical proximity correction method described with reference to FIGS. 10 through 14. For example, step S2300 may include steps S1100 through S1300 in FIG. 10, and the optical proximity correction process is performed on the plurality of layout patterns in the design layout by units of patch to obtain the corrected design layout.

A photomask is fabricated based on the corrected design layout that are corrected by the optical proximity correction process (step S2400). For example, the photomask may be manufactured by patterning a chromium layer provided on a glass substrate, using the layout pattern data.

Patterns are formed on a substrate based on the photomask to manufacture the semiconductor device (step S2500). For example, various exposure processes and etching processes may be repeated in the manufacture of the semiconductor device using the photomask. By these processes, shapes of patterns obtained in the layout design process may be sequentially formed on a silicon substrate.

Figure 18:
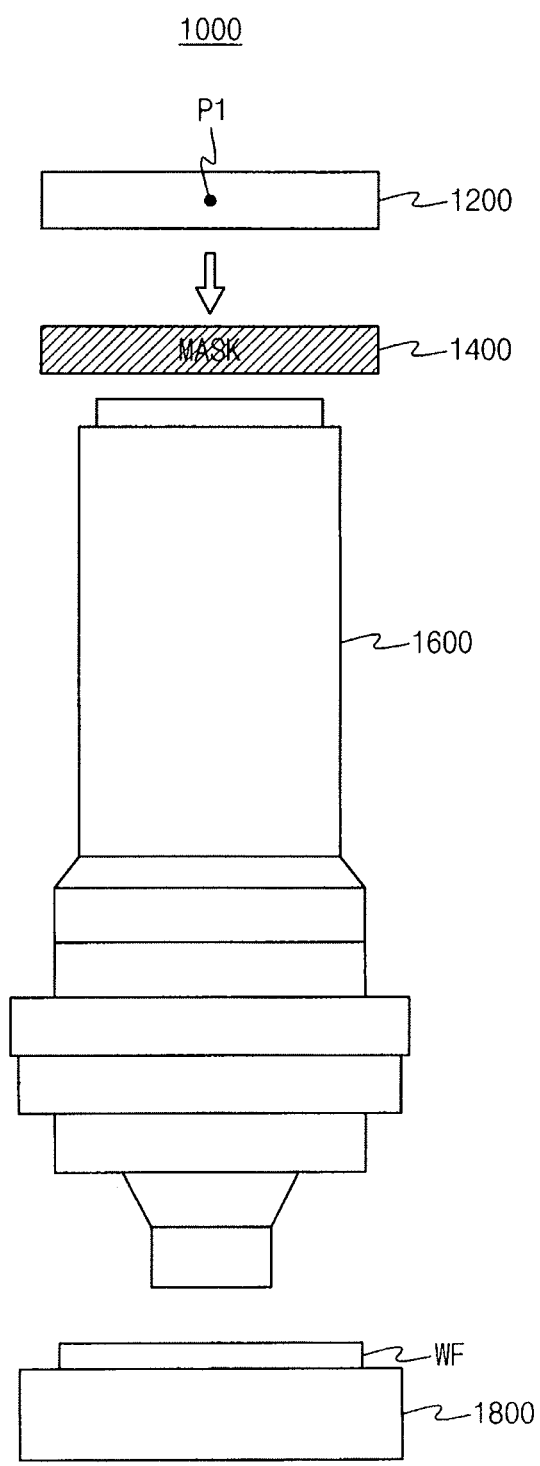
FIG. 18 illustrates a block diagram of a photolithography system that performs a method for manufacturing a semiconductor device according to an example embodiment.

FIG. 18 is a block diagram of a photolithography system that performs a method for manufacturing a semiconductor device according to example embodiments.

Referring to FIG. 18, a photolithography system 1000 may include a light source 1200, a photomask 1400, a reduction projection device 1600 and a substrate stage 1800. The photolithography system 1000 may further include components. For example, the photolithography system 1000 may further include a sensor used for measuring a height and a gradient of a surface of a substrate WF.

The light source 1200 may emit light. The light emitted from the light source 1200 may be irradiated or provided to the photomask 1400. For example, a lens between the light source 1200 and the photomask 1400 may adjust a focus of light. The light source 1200 may include an ultraviolet light source (e.g., a KrF light source having a wavelength of about 234 nm or an ArF light source having a wavelength of about 193 nm). The light source 1200 may include one point light source P1. The example embodiment may not be limited thereto. In some example embodiments, the light source 1200 may include a plurality of point light sources.

To print to realize a designed layout onto the substrate WF, the photomask 1400 may include image patterns. The image patterns may include one or more transparent regions and one or more opaque regions. The transparent regions may be formed of etching a metal layer (e.g., a chromium layer) on the photomask 1400. The transparent regions may transmit light emitted from the light source 1200. In some example embodiments, the opaque regions may not transmit light, and may block light.

The reduction projection device 1600 may receive light transmitted through the transparent regions of the photomask 1400. The reduction projection device 1600 may match layout patterns, to be printed onto the substrate WF, with the image patterns of the photomask 1400. The substrate stage 1800 may support the substrate WF. For example, the substrate stage 1800 may be a physical structure that holds the wafer WF in a desired position while the layout is printed on the substrate WF. In some example embodiments, the substrate WF may include a silicon wafer.

The reduction projection device 1600 may include an aperture, which is not illustrated in FIG. 8. The aperture may be used to increase a depth of a focus of ultraviolet light emitted from the light source 1200. For example, the aperture may include a dipole aperture or a quadruple aperture. In some example embodiments, the reduction projection device 1600 may further include a lens for adjusting a focus of light.

The transparent regions in the image patterns of the photomask 1400 may transmit light emitted from the light source 1200. Light transmitted through the photomask 1400 may be irradiated to the substrate WF through the reduction projection device 1600. Thus, patterns corresponding to the image patterns of the photomask 1400 may be printed onto the substrate WF.

In some example embodiments, as an integration degree of a semiconductor device increases, the image patterns of the photomask 1400 become closer to each other and widths of the transparent regions become narrower. Due to this proximity between transparent regions, interference and diffraction of light may occur to print a distorted layout, different from a desired layout, onto the substrate WF. If the distorted layout is printed on the substrate WF, a designed circuit may operate abnormally.

A resolution enhancement technology may be used for preventing the distortion of the layout. The optical proximity correction process is an example of a resolution enhancement technology. According to the optical proximity correction process, a degree of the distortion, e.g., the interference and diffraction of light may be predicted. In addition, based on the predicted result, image patterns to be formed on the photomask 1400 may be biased or shifted in advance. Thus, a desired layout may be printed on the substrate WF.

In some example embodiments, the optical proximity correction process may be performed to adjust or modify a single layer. In semiconductor manufacturing processes, a semiconductor device may be realized to include a plurality of layers. For example, a semiconductor device may include a plurality of layers that are stacked on one another (e.g., a plurality of stacked metal layers) to realize a specific circuit. Thus, in some example embodiments, the optical proximity correction process may be independently performed on each of the plurality of layers.

Figure 19:
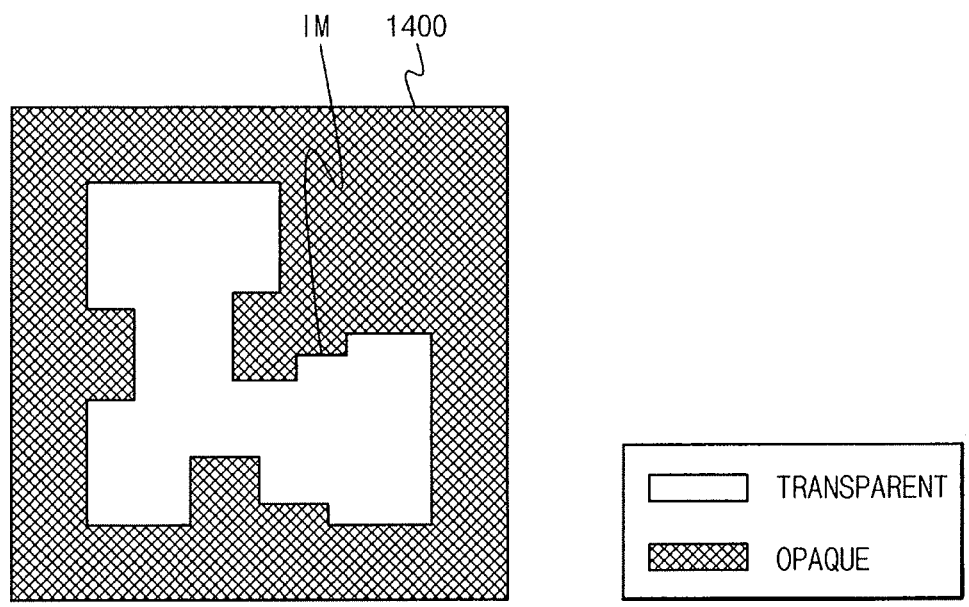
FIG. 19 illustrates a diagram of an example of a photomask that is included in the photolithography system of FIG. 18.
Figure 20:
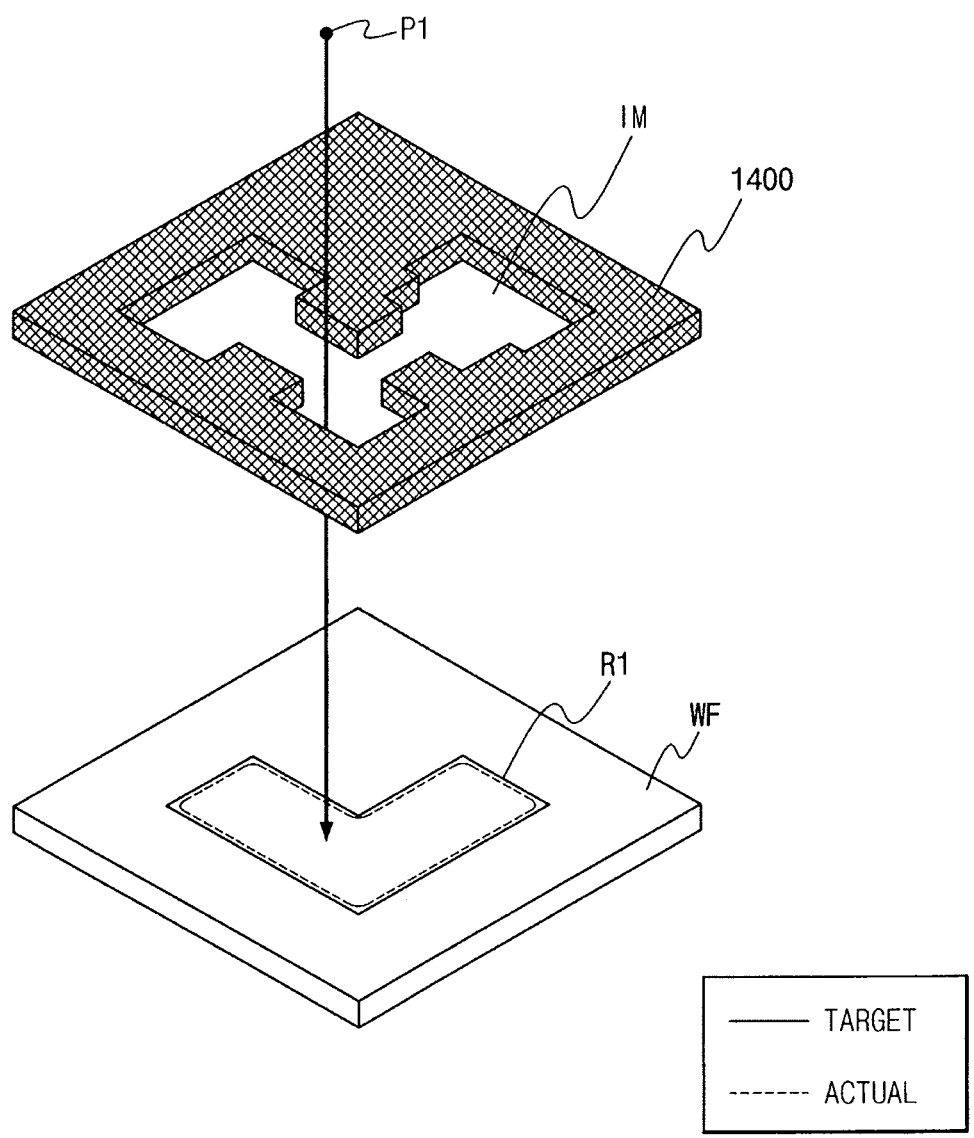
FIG. 20 illustrates a diagram of a process for printing a circuit pattern on a substrate by using the photomask of FIG. 19.

FIG. 19 is a diagram of an example of a photomask that is included in the photolithography system of FIG. 18. FIG. 20 is a diagram of a process for printing a circuit pattern on a substrate by using the photomask of FIG. 19.

Referring to FIG. 19, the photomask 1400 may include an image pattern IM corresponding to the first corrected pattern R1' in FIG. 14. The photomask 1400 may include a transparent region and an opaque region. The opaque region may not transmit light, and may block light. In some example embodiments, the transparent region may transmit light emitted from the light source 1200 in FIG. 18. Light transmitted through the photomask 1400 may be irradiated to a top surface of the substrate WF in FIG. 18. The image pattern IM may form the transparent region.

Referring to FIG. 20, the point light source P1 in the light source 1200 of FIG. 18 may emit light to the photomask 1400. The emitted light may pass through the transparent region of the image pattern IM and may be then irradiated to the substrate WF. Thus, the first circuit pattern R1 corresponding to the image pattern IM may be printed onto the substrate WF.

When a real layout is printed on the substrate WF with the photomask 1400 including the image pattern IM, the real layout may be substantially same as the desired layout and may have a small error within an acceptable threshold. The desired layout is shown by a solid line and the real layout is shown by a dotted line in FIG. 20. Thus, the optical proximity correction process may be performed to fabricate the real layer with the photomask 1400 including the biased image patterns IM and to reduce the error between the real layout and the desired layout.

Figure 21:
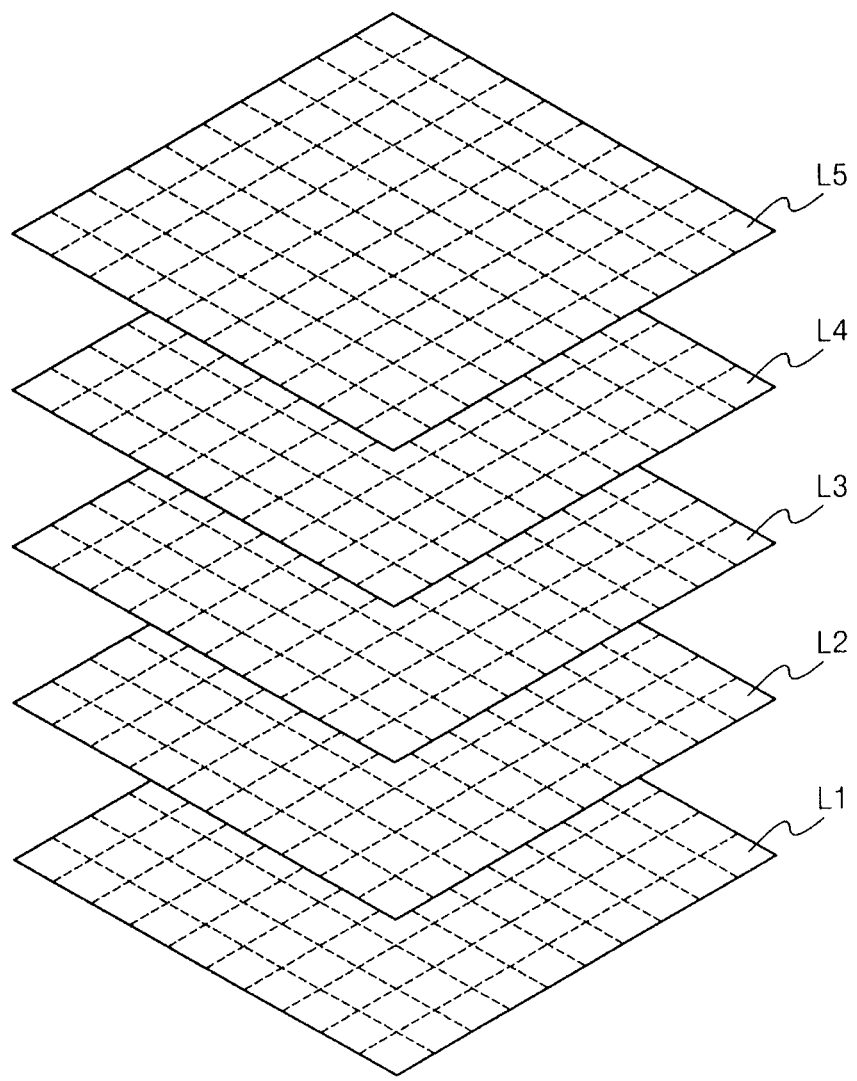
FIG. 21 illustrates a diagram of an example of a layout of a semiconductor device that is manufactured by a method for manufacturing a semiconductor device according to an example embodiment.

FIG. 21 is a diagram of an example of a layout of a semiconductor device that is manufactured by a method for manufacturing a semiconductor device according to example embodiments.

Referring to FIG. 21, a layout of the semiconductor device may include a plurality of layout layers L1, L2, L3, L4 and L5. Each of the plurality of layout layers L1~L5 may include various patterns for semiconductor circuits. For example, the layout of the semiconductor device may be a layout of a logic cell. The layout layer L1 may include a PMOS active pattern and an NMOS active pattern. The layout layer L2 may include gate patterns. The layout layer L3 may include active contact patterns and gate contact patterns. The layout layer L4 may include via patterns. The layout layer L5 may include interconnection patterns.

In some example embodiments, as illustrated in dotted lines in FIG. 21, each of the plurality of layout layers L1~L5 may be divided into a plurality of patches. The optical proximity correction process may be independently performed on each of the plurality of patches and may be independently performed on each of the plurality of layout layers L1~L5.

In the dissection method, the optical proximity correction method and the method for manufacturing the semiconductor device according to example embodiments, the target patch and the plurality of neighboring patches surrounding the target patch may be selected, the first dissection points may be set for the layout patterns in the target patch and the neighboring patches, and the second dissection points may be additionally set for the exceptional layout patterns. When the second dissection points are intentionally set on the exceptional layout patterns, the division results for all the plurality of patches may be substantially the same as or matched with each other, and thus the dissection discrepancy between two or more adjacent patches may be prevented or avoided. In addition, the center point on the edge of the exceptional layout pattern may be set to the second dissection point, and thus side effects from the intentional or artificial divisions may be reduced or minimized.

The example embodiments may be applied in a development and manufacturing phase of various types of semiconductor devices, and various apparatuses, equipment and systems for designing and manufacturing various types of semiconductor devices.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method, comprising:

providing a design layout for a target layer;

forming a corrected design layout by performing an optical proximity correction process on the design layout; and fabricating a photomask based on the corrected design layout, wherein forming the corrected design layout includes:

dividing the design layout into a plurality of patches, selecting a first group of patches from among the plurality of patches, the first group of patches being composed of a target patch and all adjoining patches that adjoin, setting a plurality of first dissection points for target layout patterns and all neighboring layout patterns in the first group of patches based on vertexes of the target layout patterns and vertexes of the neighboring layout patterns, the target layout patterns being included in the target patch, and the neighboring layout patterns being included in the adjoining patches, setting at least one second dissection point for at least one exceptional layout pattern among the target layout patterns and the neighboring layout patterns, the at least one exceptional layout pattern being a layout pattern in which no first dissection point is set in a patch among the first group of patches and which extends to pass through a boundary of one patch, setting a plurality of third dissection points for the target layout patterns and the neighboring layout patterns based on the plurality of first dissection points and the at least one second dissection point, and dividing the target layout patterns into a plurality of target segments based on the plurality of first dissection points, the at least one second dissection point, and the plurality of third dissection points, wherein the setting of the at least one second dissection point for the at least one exceptional layout pattern includes:

identifying a first exceptional layout pattern, which:
  is continuous,
  has no first dissection point set, and
  passes through two opposing boundaries of a first patch, and
setting a second dissection point for the first exceptional layout pattern at a midpoint between the two opposing boundaries of the first patch, such that the second dissection point is centered between the two opposing boundaries.

2. The method as claimed in claim 1, wherein setting the plurality of first dissection points includes:
  setting an intersection point of an edge of a first layout pattern and a first line as a first dissection point of the first layout pattern, the first line extending from a vertex of a second layout pattern adjacent to the first layout pattern and being perpendicular to the edge of the first layout pattern.

3. The method as claimed in claim 2, wherein a distance between the first layout pattern and the second layout pattern is shorter than a reference distance.

4. The method as claimed in claim 1, wherein exactly eight adjoining patches adjoin the target patch.

5. The method as claimed in claim 4, wherein each of the plurality of patches has a same shape and a same size.

6. The method as claimed in claim 5, wherein each of the plurality of patches has a rectangular shape.

7. The method as claimed in claim 1, wherein dissection points in one layout pattern are set at same positions of opposite edges of the one layout pattern, the same positions facing each other.

8. The method as claimed in claim 1, wherein dissection points in one layout pattern are set on different positions of opposite edges of the one layout pattern, the different positions not facing each other.

9. The method as claimed in claim 1, wherein positions of dissection points that are set by selecting a first patch as the target patch are the same as positions of dissection points that are set by selecting a second patch adjacent to the first patch as the target patch.

10. A method, comprising:
  providing a design layout for a target layer;
  forming a corrected design layout by performing an optical proximity correction process on the design layout; and
  fabricating a photomask based on the corrected design layout, wherein forming the corrected design layout includes:
  dividing the design layout into a plurality of patches,
  selecting a first group of patches from among the plurality of patches, the first group of patches being composed of a target patch and all adjoining patches that adjoin the target patch,
  setting a plurality of first dissection points for target layout patterns and all neighboring layout patterns in the first group of patches based on vertexes of the target layout patterns and vertexes of the neighboring layout patterns, the target layout patterns being included in the target patch, and the neighboring layout patterns being included in the adjoining patches,
  setting at least one second dissection point for at least one exceptional layout pattern among the target layout patterns and the neighboring layout patterns, the at least one exceptional layout pattern being a layout pattern in which no first dissection point set in a patch among the first group of patches and which extends to pass through a boundary of one patch,
  setting a plurality of third dissection points for the target layout patterns and the neighboring layout patterns based on the plurality of first dissection points and the at least one second dissection point,
  dividing the target layout patterns into a plurality of target segments based on the plurality of first dissection points, the at least one second dissection point, and the plurality of third dissection points, and
  biasing at least one of the plurality of target segments to obtain the corrected design layout,
  wherein the setting of the at least one second dissection point for the at least one exceptional layout pattern includes:
  identifying a first exceptional layout pattern, which:
    is continuous,
    has no first dissection point set, and
    passes through two opposing boundaries of a first patch, and
  setting a second dissection point for the first exceptional layout pattern at a midpoint between the two opposing boundaries of the first patch, such that the second dissection point is centered between the two opposing boundaries.

11. The method as claimed in claim 10, wherein each of the plurality of patches is a standard unit for performing the optical proximity correction process.

12. The method as claimed in claim 10, wherein biasing the at least one of the plurality of target segments includes:
  biasing a first target segment in a first direction, and biasing a second target segment in a second direction different from the first direction.

13. The method as claimed in claim 10, wherein:
  the optical proximity correction process is performed by an optical proximity correction tool, and
  each of the plurality of patches is provided into a respective one of a plurality of nodes in a processing system of the optical proximity correction tool when the optical proximity correction process is performed.

14. The method as claimed in claim 13, wherein the plurality of nodes include a plurality of processor cores for processing data.

15. The method as claimed in claim 13, wherein the optical proximity correction process is performed in parallel in the plurality of nodes.

16. A method for manufacturing a semiconductor device, the method comprising:
  obtaining a design layout for a layer in the semiconductor device;
  forming a corrected design layout by performing an optical proximity correction process on the design layout;
  fabricating a photomask based on the corrected design layout; and
  forming the layer on a substrate using the photomask,
  wherein forming the corrected design layout includes:
  dividing the design layout into a plurality of patches,
  selecting a first group of patches from among the plurality of patches, the first group of patches being composed of a target patch and all adjoining patches that adjoin the target patch,
  setting a plurality of first dissection points for target layout patterns and all neighboring layout patterns in the first group of patches based on vertexes of the target layout patterns and vertexes of the neighboring layout patterns, the target layout patterns being included in the target patch, and the neighboring layout patterns being included in the adjoining patches, setting at least one second dissection point for at least one exceptional layout pattern among the target layout patterns and the neighboring layout patterns, the at least one exceptional layout pattern being a layout pattern in which no first dissection point is set in a patch among the first group of patches and which extends to pass through a boundary of one patch, setting a plurality of third dissection points for the target layout patterns and the neighboring layout patterns based on the plurality of first dissection points and the at least one second dissection point, dividing the target layout patterns into a plurality of target segments based on the plurality of first dissection points, the at least one second dissection point and the plurality of third dissection points, and biasing at least one of the plurality of target segments to obtain the corrected design layout, wherein the setting of the at least one second dissection point for the at least one exceptional layout pattern includes:

identifying a first exceptional layout pattern, which:

is continuous, has no first dissection point set, and passes through two opposing boundaries of a first patch, and setting a second dissection point for the first exceptional layout pattern at a midpoint between the two opposing boundaries of the first patch, such that the second dissection point is centered between the two opposing boundaries.

17. The method as claimed in claim 16, wherein:

each of the plurality of patches corresponds to one region of circuit patterns to be printed on the substrate, and the one region is a quadrilateral region having a length of one edge of about 1 μm to about 99 μm.

18. The method as claimed in claim 16, wherein:

the semiconductor device includes a plurality of layers that are stacked on one another, and the optical proximity correction process is independently performed on each of the plurality of layers.

* * * * *